United States Patent [19]
Maier et al.

[11] Patent Number: 5,786,692
[45] Date of Patent: Jul. 28, 1998

[54] LINE SCAN DIFFUSION IMAGING

[75] Inventors: Stephan E. Maier; Hakon Gudbjartsson, both of Brookline, Mass.

[73] Assignee: Brigham and Women's Hospital, Inc., Boston, Mass.

[21] Appl. No.: 689,949

[22] Filed: Aug. 16, 1996

Related U.S. Application Data

[60] Provisional application No. 60/002,478 Aug. 18, 1995.
[51] Int. Cl.$^6$ .................................................. G01V 3/00
[52] U.S. Cl. .................................. 324/307; 324/309
[58] Field of Search .................................. 324/300, 306, 324/307, 309, 318; 128/653.3

[56] References Cited

U.S. PATENT DOCUMENTS

| | | | |
|---|---|---|---|
| 4,583,044 | 4/1986 | Case et al. | 324/309 |
| 4,698,592 | 10/1987 | Feinberg | 324/309 |
| 4,818,937 | 4/1989 | Ailon et al. | 324/309 |
| 5,025,788 | 6/1991 | Dumoulin | 324/306 |
| 5,345,175 | 9/1994 | Kasuboski et al. | 324/309 |
| 5,410,248 | 4/1995 | Dumoulin | 324/306 |

OTHER PUBLICATIONS

"A Time Encoding Method for Single–Shot Imaging", M. Elizabeth Meyerand et al., MRM, vol. 34, pp. 618–622 (1995).
"Abdominal Diffusion Mapping with Use of a Whole–Body Echo–Planar System", Markus F. Müller et al., Radiology, vol. 190, No. 2, Feb. 1994, pp. 475–478.
"An in Vivo NMR Imaging Determination of Multiexponential Hahn T$_2$ of Normal Lung", Sumie Shioya et al., Magnetic Resonance in Medicine, vol. 16, pp. 49–56 (1990).
"Comparison of Line–Scan with Echo–Planar Diffusion Imaging", S. E. Maier et al., one page, Apr. 27, 1996.
"Diffusion Imaging on Low–Field Systems Using the LSDI Technique", H. Gudbjartsson et al., one page, Apr. 27, 1996.
"Diffusion MR Imaging: Clincal Applications", Denis Le Bihan et al., AJR 159:591–599, Sep. 1992.
"Difussion Weighted Linescan Imaging", H. Gudbjartsson et al., Massachusetts Institute of Technology, EECS, One page, Aug. 19, 1995.
"MR Imaging of Intravoxel Incoherent Motion: Application to Diffusion and Perfusion in Neuroligic Disorders", Denis Le Bihan et al., Radiology, vol. 161, No. 2, pp. 401–407 (1986).
"Quantitative Measurement of Tissue Perfusion and Diffusion in Vivo", Thomas L. Chenevert et al., Magnetic Resonance in Medicine, vol. 17, pp. 197–212 (1991).
"Rapid Line Scan Tecnique for Artifact–Free Images of Moving Objects", David C. Ailon et al., Magnetic Resonance Imaging, vol. 10, pp. 747–754 (1992).
"Tissue Perfusion in Humans Studied by Fourier Velocity Distribution, Line Scan, and Echo–Planar Imaging", David A. Feinberg et al., Magnetic Resonance in Mediccine, vol. 16, pp. 280–293 (1990).

Primary Examiner—Louis M. Arana
Attorney, Agent, or Firm—Wolf, Greenfield & Sacks, P.C.

[57] ABSTRACT

Magnetic resonance imaging appparaus and methods, including providing selective radio frequency pulses including pairs of pulses, which define planes with an intersection that defines an imaging volume. The imaging volumes are part of a first image surface passing through the sample and having a spatial orientation that differs from the spatial orientation of the planes. The method further includes providing magnetic diffusion gradients in the sample which are associated with at least a subset of the volumes, and acquiring a series of nuclear magnetic resonance echo signals resulting from the intersection, with at least a subset of the echo signals being responsive to the gradients. The signals are processed to obtain an image that includes lines corresponding to the imaging volumes.

46 Claims, 15 Drawing Sheets

LINE SCAN DIFFUSION IMAGING

RELATED APPLICATION

This application claims the benefit of U.S. Provisional Application No. 60/002,478, filed Aug. 18, 1995.

FIELD OF THE INVENTION

This invention relates to magnetic resonance line scan and line scan diffusion imaging.

BACKGROUND OF THE INVENTION

Magnetic resonance (MR) imaging systems can be used for obtaining diagnostic images of patients, or for noninvasive testing of objects. Diffusion imaging is a form of MR imaging that derives an image based on the mobility of liquids in the volume to be imaged. One approach to in vivo diffusion imaging is called diffusion-weighted echo-planar diffusion imaging (EPI), which is a one-shot technique that allows relatively rapid scanning, but which requires expensive imaging hardware. In comparison to conventional 2DFT imaging techniques, line scan imaging techniques proposed so far have generally yielded significantly inferior images, and these techniques have therefore been of somewhat limited use. And while line scanning techniques for diffusion imaging of one-dimensional profiles have been discussed and the idea of multicolumn line scanning has also been proposed, a specific, practical, and optimized method for line scan diffusion imaging has not been presented.

SUMMARY OF THE INVENTION

The invention features magnetic resonance imaging apparatus and methods. In one general aspect, the invention features a magnetic resonance imaging method that includes providing selective radio frequency pulses including pairs of pulses, which define planes with an intersection that defines an imaging volume. The imaging volumes are part of a first image surface passing through the sample and having a spatial orientation that differs from the spatial orientation of the planes. The method further includes providing magnetic diffusion gradients in the sample which are associated with at least a subset of the volumes, and acquiring a series of nuclear magnetic resonance echo signals resulting from the intersection, with at least a subset of the echo signals being responsive to the gradients. The signals are processed to obtain an image that includes lines corresponding to the imaging volumes.

In preferred embodiments, at least some of the individual volumes in the first set of volumes can overlap. The volumes can be defined in an interleaved sequence that separates in time the definition of spatially adjacent volumes by defining others during the period between the adjacent ones. The method can further include, before providing the pulses, providing dummy pulses, which define dummy volumes, with the later step of providing a series of pulses defining volumes coextensive with the dummy volumes. The volumes can be acquired in a series of successively offset sweeps across the image surface, with the first being a dummy sweep. The total number of lines per image acquired can be odd. The orientation of successively defined pairs of the pulses, can be swapped such that the plane defined by the first pulse in time in the first of the successive pairs does not coincide within the sample with the plane defined by the last pulse in time in the second of the pairs. The step of acquiring can be performed without any crusher gradients. At least a third pulse can be provided for each of the pairs, and it can intersect one of the planes at an intersection that defines a further imaging volume that is part of a second image surface. Magnetic dephasing and rephasing gradients can be provided to separate the echo signals. The magnetic dephasing and rephasing gradients and a magnetic diffusion gradient can be parallel for the volume defined for each pair and the volume defined for the third pulse and that pair. The step of acquiring can employ an echo-volumar or echo-planar sequence. The pulses in each of the pairs can be multiple-frequency pulses. Differing diffusion gradients can be provided for successively defined imaging volumes. Further imaging volumes defined by further pairs can define a second image surface passing through the sample adjacent the first image surface, the imaging volumes that are part of the first surface may all be defined before the imaging volumes that are part of the second surface are defined, and these can overlap.

In further preferred embodiments, the first image can be used to evaluate tissue ischemia, cardiac gating can be used to obtain diffusion images of the heart, volumes can be acquired during breathhold, and/or the image can be used to monitor temperature. The acute angle between the planes defined by the pulses in each pair can be less than about fifteen degrees, with the acquisition employing an echo-planar sequence. Saturation pulses can be provided to saturate signals from unwanted volumes within the sample. Diffusion values measured within the imaging volumes can be enhanced such that the image generated in the step of processing employs a higher b-factor than one resulting from the magnetic diffusion gradients. A plane defined by a third pulse can intersect with the volume defined by one of the pairs of pulses, such that the echoes acquired in the step of acquiring are stimulated echoes. The pulses can define the imaging volumes in a radial pattern. The acute angles between the image surface and each of the planes can be equal, and/or can be in the range of 65 degrees to 75 degrees. The image surface can be a closed or overlapping surface.

In another general aspect, the invention features a magnetic resonance imaging method that includes providing pairs of pulses. These define planes with an intersection that defines an imaging volume. The orientation of successively defined pairs is swapped, such that the plane defined by the first pulse in time in the first of the successive pairs does not coincide within the sample with the plane defined by the last pulse in time in the second of the successive pairs. The method further includes acquiring a series of echo signals resulting from the intersection. The signals are processed to obtain an image that includes lines corresponding to the imaging volumes.

In a further general aspect, the invention features a magnetic resonance imaging method that includes providing pairs of pulses. These define planes that intersect at an intersection that defines an imaging volume, and the imaging volumes are part of a first image surface passing through the sample. The step of providing a series of selective radio frequency pulses is performed in an interleaved manner to successively define the imaging volumes with different sensitivities to a parameter. The method further includes acquiring a series of echo signals resulting from the intersection. The signals are processed to obtain an image that includes lines corresponding to the imaging volumes.

In preferred embodiments, the parameter relates to the magnetic diffusion gradients, and differing diffusion gradients are provided for successive imaging volumes. The differing magnetic diffusion gradients may differ in their magnitude, direction, and/or polarity. Four differing diffusion gradients may be provided, including a low magnitude diffusion gradient and including three orthogonally oriented high magnitude diffusion gradients. Six differing diffusion gradients may also be provided, including three orthogonally oriented low magnitude diffusion gradients and three orthogonally oriented high magnitude diffusion gradients.

In another general aspect, the invention features a magnetic resonance imaging method that includes simultaneously exciting orthogonal gradient coils to a first plurality of extents during a magnetic resonance imaging sequence to sensitize the sequence to diffusion in a first direction, and simultaneously exciting the orthogonal gradient coils to a second plurality of extents during a second magnetic resonance imaging sequence to sensitize the sequence to diffusion in a second direction, the first direction being orthogonal to the second direction.

Preferred embodiments can include simultaneously exciting the coils to a third plurality of extents during a third magnetic resonance imaging sequence to sensitize the sequence to diffusion in a third direction, with the first, second, and third directions being orthogonal to each other, where each of the steps of simultaneously exciting includes exciting each of the first, second, and third of the three orthogonal gradient coils. The first direction can be defined by relative amplitudes of $(-1, 1, -\frac{1}{2})$ the second direction can be defined by relative amplitudes of $(1, \frac{1}{2}, -1)$ and the third direction can be defined by relative amplitudes of $(\frac{1}{2}, 1, 1)$.

In a further general aspect, the invention features providing a series of pulses that include pairs including a selective two-dimensional pulse and another selective pulse. The two dimensional pulse in each pair defines a pulse-defined volume and the other pulse defines a plane that intersects the pulse-defined volume at an intersection that defines an imaging volume. The imaging volumes form part of image surfaces passing through the sample. The method further includes providing magnetic diffusion gradients in the sample and associated with at least a subset of the imaging volumes, and acquiring a series of nuclear magnetic resonance echo signals resulting from the intersection, with at least a subset of the echo signals being responsive to the influence of the diffusion gradients. The signals are processed to obtain images that include lines corresponding to the imaging volumes.

In preferred embodiments, the selective two-dimensional radio frequency pulses can be two-dimensional spiral pulses. The step of providing pulses can alternate between defining imaging volumes in different individual image surfaces. The two-dimensional pulses can be Fourier-spliced pencil pulses, with the pulse-defined volumes being strips that extend across more than one of the image surfaces, with acquisitions employing an echo-planar sequence. Further images can be obtained that each include lines corresponding to the further imaging volumes in further imaging surfaces.

Generally, the invention permits new methods for MR diffusion imaging including the quantification of diffusion in tissues. These methods can easily be implemented on existing MR scanners, since they do not require special gradient hardware or image post processing. The total scan time for quantitative diffusion maps, including the trace of the diffusion tensor, may be less than three minutes, and such scans have even been achieved in less than one minute. The image plane can be oriented arbitrarily for the quantification of diffusion in brain tissue and abdominal organs, and head restraints and EKG gating are not necessary. This makes the sequence particularly useful in a clinical setting. Corresponding apparatus is contemplated to implement each of the methods, as described below.

DETAILED DESCRIPTION

Figure 1:
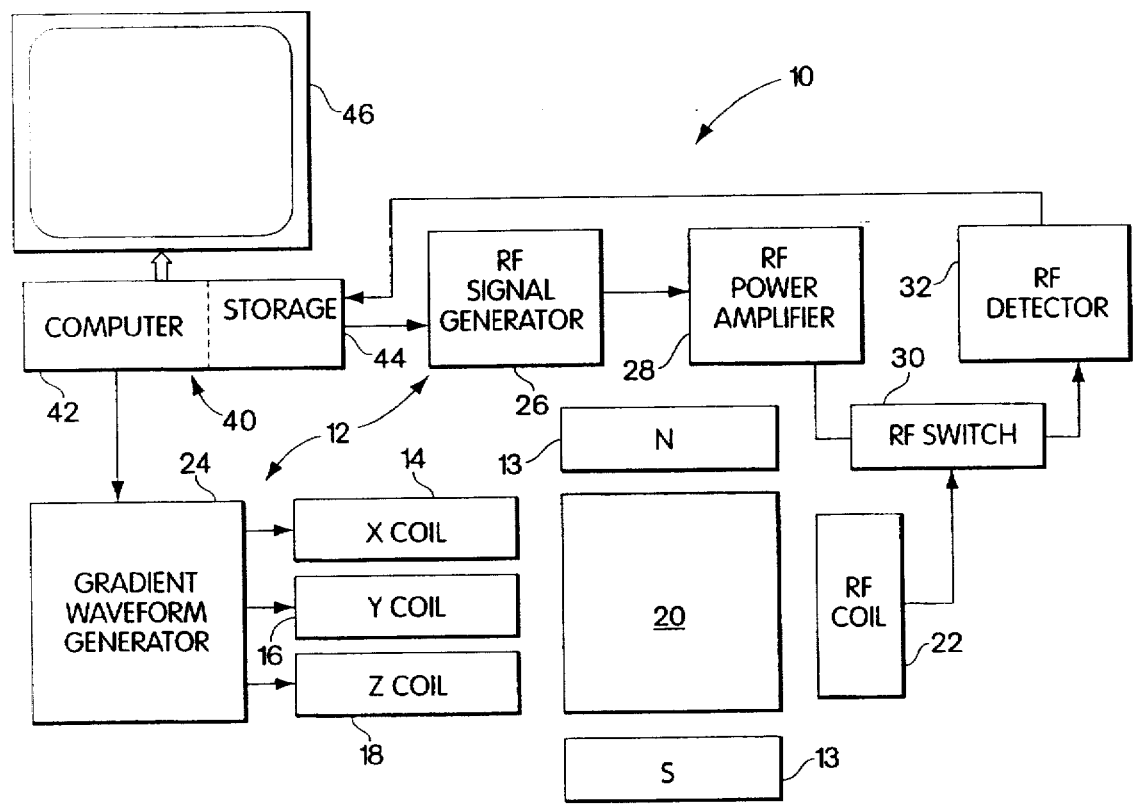
FIG. 1 is a high level block diagram of an illustrative embodiment of a magnetic resonance imaging system according to the invention.

Referring to FIG. 1, an illustrative magnetic resonance imaging system 10 generally includes a magnet assembly, interface circuitry, and a computer 40. The magnet assembly includes a very strong magnet 13 that creates a homogeneous magnetic field within and around a sample (e.g., an inert sample or patient). X, Y, and Z magnetic field gradient coils 14, 16, and 18 also form a part of the assembly and are positioned proximate or surrounding the sample 20. The assembly further comprises one or more RF coils 22, which are positioned near or around the sample.

The interface circuitry includes a gradient waveform generator 24 that has signal outputs connected to the gradient coils 14, 16, and 18, and a control input connected to the computer. An RF signal generator 26 also has a control input connected to the computer, and an output connected to an input of an RF power amplifier 28. The RF power amplifier has an output connected to an input of an RF switch 30. The RF switch is connected to the RF coil 22, and has an output connected to the input of an RF detector 32.

The computer 40 includes computing hardware 42 and storage 44. The computing hardware can comprise special purpose hard-wired computing circuitry dedicated to MR acquisition and imaging, a specially programmed general purpose computer, or a combination of both. The storage 46 can include various types of storage, such as disk storage and random access memory. The storage can be used to store data and programs, including the programs used to interact with the system's interface circuitry 12. The computer has a video output for providing video signals to a display 46, as well as control outputs connected respectively to control inputs of the gradient waveform generator 24 and the RF signal generator 26. The computer also has an acquisition input operatively connected to an output of the RF detector 32.

Figure 2:
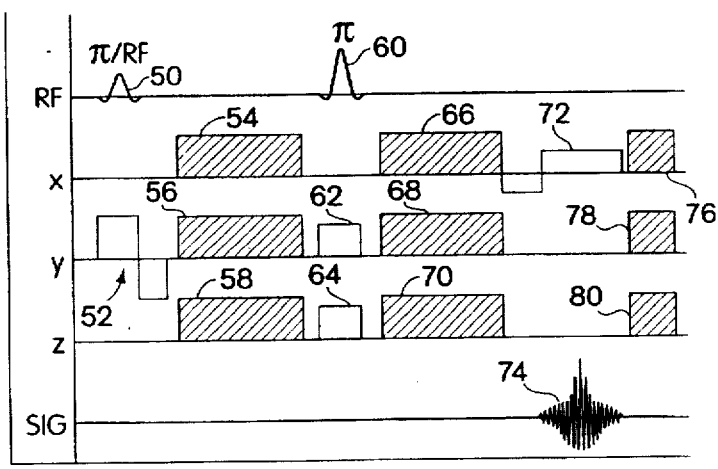
FIG. 2 is an imaging sequence diagram for the acquisition of one line of data from one column using the embodiment of FIG. 1.

In operation, referring to FIGS. 1 and 2, the imaging system 10 builds an image on a line-by-line basis under control of the computer 40 according to a line scan diffusion imaging (LSDI) sequence. At the beginning of an acquisition sequence for a line, the computer 44 sends a signal to the RF signal generator 26, which responds by generating a π/2 pulse. This pulse is amplified by the RF power amplifier 28 and provided to the RF coil 22 via the RF switch 30. As this pulse is being provided, the computer instructs the gradient waveform generator 24 to drive the Y coil 16 with a slice selective bipolar pulse 52.

Next, the gradient waveform generator 24 provides a first set of diffusion gradient pulses 54, 56, and 58 respectively to the X, Y, and Z gradient coils 14, 16, and 18. These gradient signals each include a single rectangular pulse, which is provided in order to sensitize the MR imaging process to diffusion. After the falling edge of the diffusion gradient signals, a π pulse 60 is provided to the RF coil 22 in much the same way that the π/2 pulse was. At the same time, the gradient waveform generator provides a rectangular pulse on each of the Y and Z gradient coils (pulses 62, 64). These pulses are of lower amplitude and shorter duration than the diffusion gradient pulses. Then, the waveform generator provides a second set of diffusion gradient signals 66, 68, and 70 respectively to the X, Y, and Z gradient coils 14, 16, and 18. These second diffusion gradient signals are of the same amplitude and duration as the first diffusion gradient signals. Once the second diffusion gradient signals are turned off, the gradient waveform generator provides a readout pulse 72 on the X coil 14.

As a result of this excitation sequence, an echo 74 is received from the intersection of the planes defined by the π and π/2 pulses. The RF coil receives this echo and provides it via the RF switch 30 to the RF detector 32. The computer 40 receives the output of the detector, and processes it to obtain one line to be displayed on the display 46. After the echo has been received, optional crusher gradient signals 76, 78, and 80 can be applied to the gradient coils 14, 16, and 18.

In one embodiment using a 1 Gauss/cm field-strength system, the selection pulses 50, 60 are 2.5–5 ms in duration. The diffusion gradient pulses 54, 56, 58, 66, 68, and 70, are 25–50 ms in duration. The crusher gradients 76, 78, and 80 are held for 2–5 ms, and the acquisition time is 32 ms. The bandwidth is 4 kHz. Other values for these settings are also possible. General information about MR imaging systems may be found in Dumoulin, U.S. Pat. No. 5,410,248 issued Apr. 25, 1995, and herein incorporated by reference.

Figure 3:
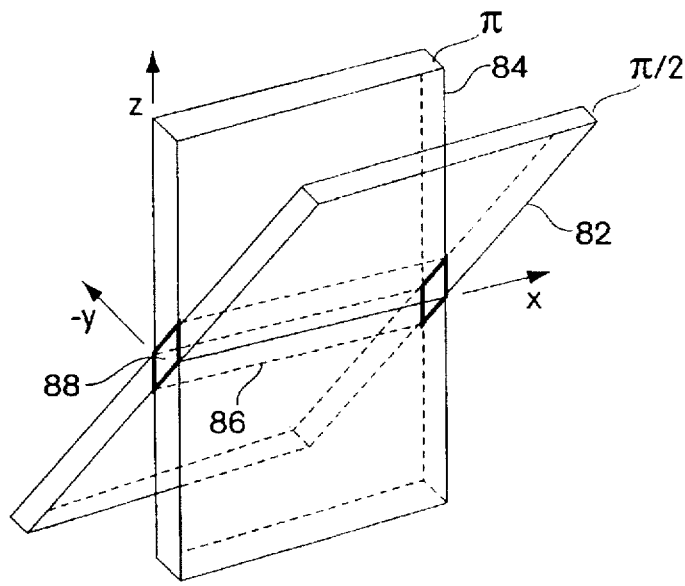
FIG. 3 is an illustration of an imaging volume defined by $\pi$ and $\pi/2$ planes produced by the sequence of FIG. 2.
Figure 4:
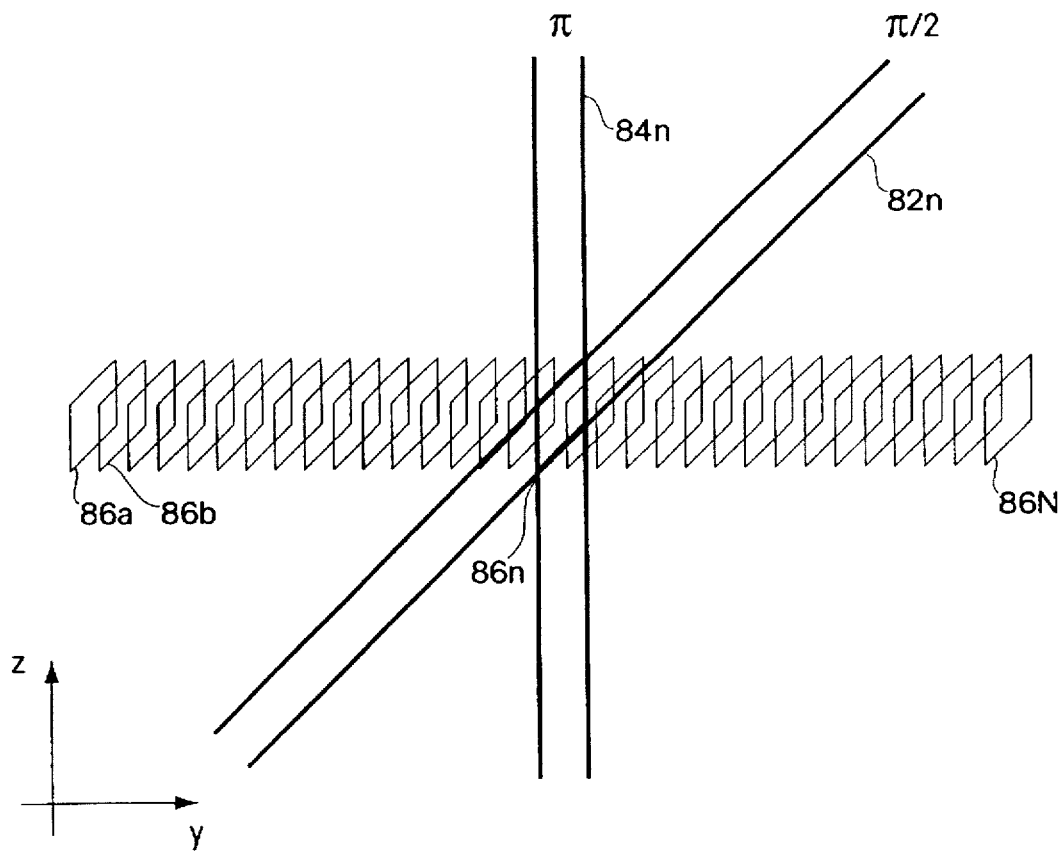
FIG. 4 is a diagram oriented in the y-z plane and illustrating a series of successive columns, and showing representative $\pi$ and $\pi/2$ pulses used in the acquisition of an image by repeated application of the sequence of FIG. 2, for one of the columns.

Referring also to FIGS. 3 and 4, the π/2 pulse 50 and π pulse 60 in combination with the gradient pulses 52, 62, and 64 provided to the gradient coils 14, 16, and 18 define two planes 82 and 84 corresponding respectively to the π/2 pulse 50 and the π pulse 60. At the intersection of these planes is a column 86 which can be described as a parallelepipied imaging voxel, which has a parallelogram-shaped cross-section 88. This column is the source of information in the echo 74, which is processed by the computer 40 to form one line of an MR image.

By repeatedly exciting the sample 20 with RF stimuli in the presence of the gradients as described above and acquiring the resulting echoes, a succession of neighboring columns 86a, 86b ... 86n ... 86N, can be isolated within an imaging plane in the sample, and the diffusion image can be built up of lines corresponding to these columns on the display 46. As is shown in the art, by varying the RF carrier frequency, the positions of the image plane, which are defined by the aggregation of columns 86A, 86B ... 86n ... 86N, can be placed at a desired location and orientation within the sample or patient. Sequences with differing gradient fields can be used to define different angles between the plane 82 defined by the π/2 pulse 50 and the plane 84 defined by the π pulse 60 (compare FIGS. 4 and 5), and different thicknesses for the slices defined by these planes. The frequency of the RF pulses are determined in the usual manner for slice selective pulses with an additional linear rotation-transformation that takes into consideration the orientation of the gradients.

Figure 5:
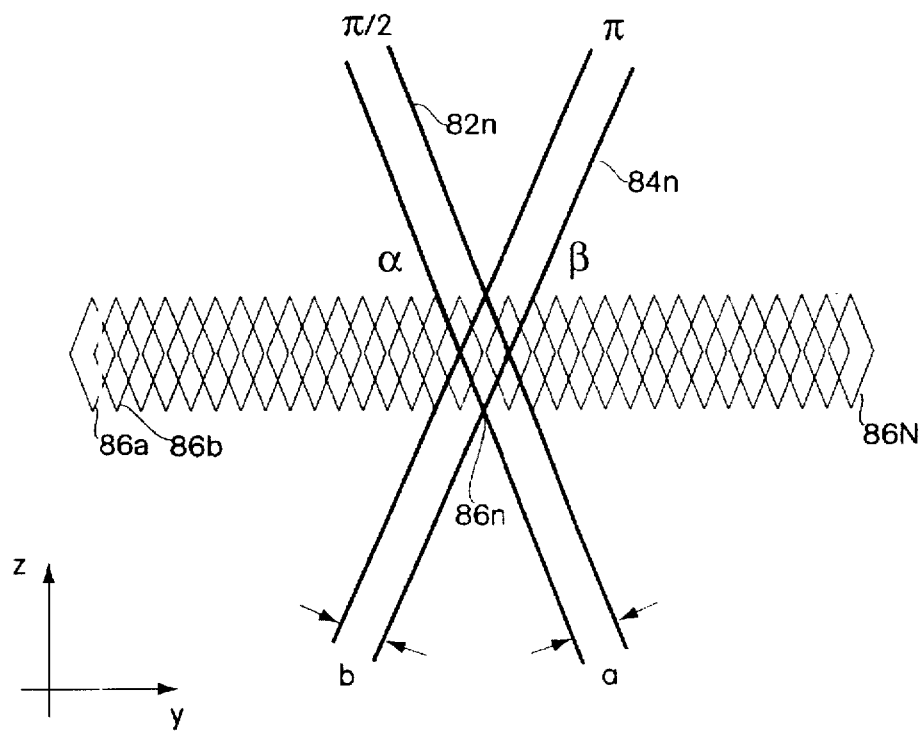
FIG. 5 is a diagram oriented in the y-z plane and illustrating an alternative series of successive columns used in the acquisition of an image, and representative $\pi$ and $\pi/2$ pulses for one of the columns.
Figure 6:
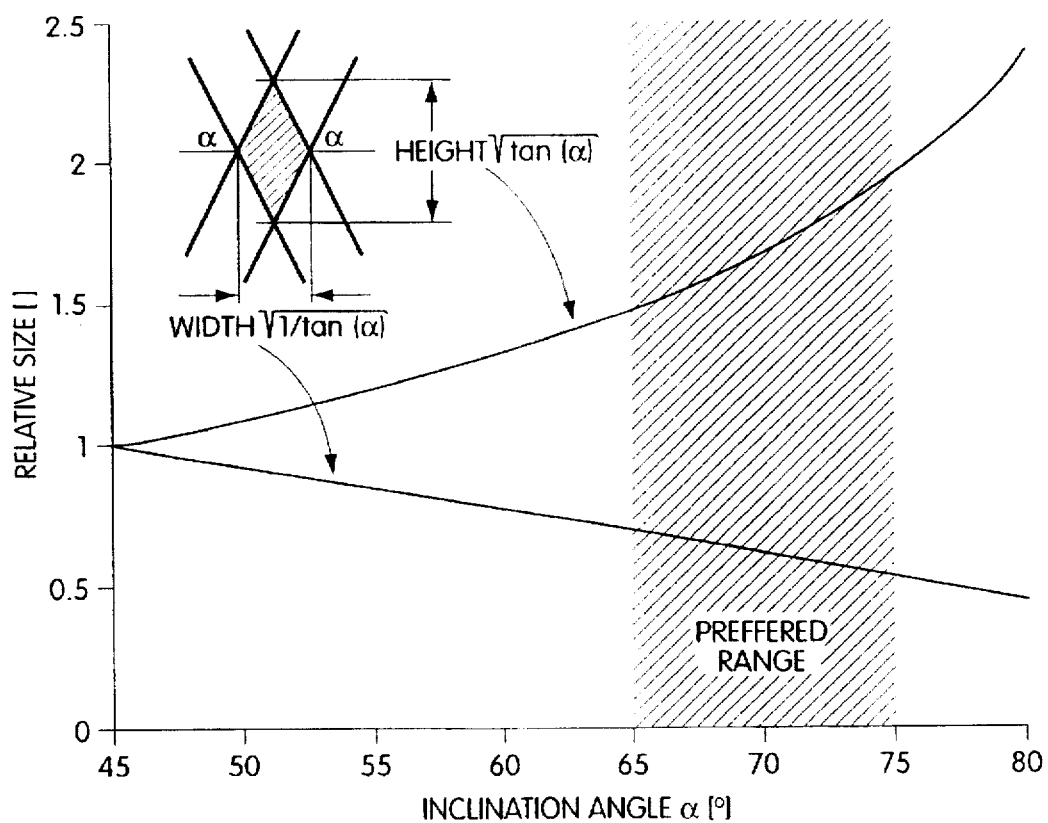
FIG. 6 is a graph of height and width of columns against inclination angle for a constant cross-sectional area using the arrangement of FIG. 5.

As shown in FIG. 6 and Table 1, the height/width ratio of the cross-section 88 of the image volume 86 for the arrangement shown in FIG. 5 is equal to the tangent of the angle α which in this case is between the π/2 plane 82, and the image plane as well as between the π plane 84 and the image plane. To provide for enhanced signal-to-noise performance when imaging anatomic features, physicians have found that it is beneficial to employ a height/width ratio of approximately 2:1–4:1 in conventional 2D spin-warp Fourier imaging. This ratio can be achieved by setting the angle α equal to a number between approximately 65 and 75 degrees, as shown in FIG. 6. By setting this angle in this range, in-plane resolution is enhanced at the expense of slice resolution, which is preferable for viewing anatomical features axially.

TABLE 1

|  | 45° | 65° | 75° | α |
|---|---|---|---|---|
| Relative Area | 1 | 1 | 1 | 1 |
| Relative Selection Slice Thickness (π, π/2) | 1 | 0.88 | 0.71 | $\sqrt{2}\sin\alpha\cos\alpha$ |
| Relative Width | 1 | 0.68 | 0.52 | $\sqrt{1/\tan\alpha}$ |
| Height/Width | 1 | 2.1 | 3.7 | $\tan\alpha$ |

Line scan diffusion imaging uses multiple diffusion weighted spin-echo column excitations to form a two-dimensional image. As shown in FIG. 2, the basic sequence is composed of a one or two-dimensional selective π/2 pulse and a selective π pulse with diffusion gradients in arbitrary direction and arrangement on both sides of the refocusing π pulse, followed by a standard frequency encoding readout along the selected column. This can be combined with any technique for multiple gradient echo or spin echo read out. The image is composed of the magnitude data obtained from a one-dimensional Fourier transform of the acquired signal from a series of parallel columns in the image plane. The sequential collection of this line data in independent acquisitions can make the sequence insensitive to bulk motion artifacts, since no phase encoding is used and shot-to-shot phase variations are fully removed by calculating the magnitude of the signal.

Two images, one with diffusion gradients and one without, can be used to assess the diffusion coefficient in the direction of the diffusion gradient. Because of the microscopic structure of tissues the diffusion is anisotropic, and measurements in three orthogonal directions should be obtained in order to acquire a true diffusion map (trace of the diffusion tensor) and information about tissue structure related to diffusion anisotropy. To date, this has generally been done by measuring the diffusion along the x, y and z magnetic field gradients of the MR image. Simultaneous use of all three gradients results in a considerably higher gradient amplitude.

If the maximal relative gradient amplitude in $\hat{x}$, $\hat{y}$ and $\hat{z}$ direction is equal, the sequence of FIG. 2 employs a new orthogonal coordinate system as:

$$\hat{x}' = -\hat{x} + \hat{y} - \hat{z}/2 \quad (1)$$
$$\hat{y}' = \hat{x} + \hat{y}/2 - \hat{z}$$
$$\hat{z}' = \hat{x}/2 + \hat{y} + \hat{z}$$

$\hat{x}'$, $\hat{y}'$ and $\hat{z}'$ are mutually orthogonal. Furthermore, this choice of axis gives the maximum gradient strength for three orthogonal directions, $G_{x'}$, $G_{y'}$ and $G_{z'}$. The gradient amplitude gain is 50% compared to using the conventional gradient axes. For a given diffusion sensitivity, the duration and ultimately the echo time can be reduced by approximately one fourth because the effect of the diffusion gradients is proportional to the square of their amplitude and the cube of their duration. The disadvantage of using this modified gradient axis is that they no longer coincide with the principal axis of the image. For diffusion tensor trace and anisotropy maps, this does not pose any problems, since the trace is rotation invariant.

In the repetitive process of line acquisition for imaging, one might expect that the procedure could lead to spin saturation and subsequent tissue specific signal loss, unless a sufficient period of time between column excitations is permitted. For human tissue the minimal period is of the order of 3 seconds. For quantitative diffusion trace maps composed of 256 lines, a patient's residence time in the scanner could take approximately one hour.

The excitation orientations shown in FIGS. 4 and 5, however, allows for a faster repetition of the excitation, without causing spin saturation. The basic principle is to avoid an alignment between the planes excited by the selective pulses and the imaging plane. The selected planes are positioned such that the volume at their intersection forms the column of interest in the imaging plane, and the angles α and β between the selective planes and the imaging plane (see FIG. 5) can be chosen arbitrarily. The orientation shown in FIG. 4 is preferred if the columns do not overlap, because the signal is constant along the y-axis. For imaging with overlapping columns the symmetric solution (α=β, a=b) is advantageous, because most of the signal derives from the central portion of the cross section, where the overlap is minimal. For each volume element this results in a signal distribution that is analogous to conventional Fourier imaging, where the signal contribution of neighboring volume elements decays with distance, according to a sinc function. The height of the selected column defines the slice thickness and the width defines the in-plane resolution.

As discussed above, in conventional imaging the established ratio between slice thickness and in-plane resolution lies in the range of 2:1 and 4:1, and this can ensure maximal resolution of anatomic detail under the constraints of signal-to-noise. In the case of LSDI for a constant cross-sectional area inclination angles between 65° and 75° produce a similar range of height to width ratio, as shown in FIG. 6. Compared to an inclination at 45°, an inclination at 70° improves the in-plane resolution by 40%, without reducing the signal-to-noise ratio of the acquired signal. On the other hand, the 70° inclination decreases the overlapping of columns by 40%, compared to the overlapping at 45° inclination, which further reduces the problem of spin saturation. Some overlap is desirable, however, because it avoids under sampling, which results in what is known as aliasing. If the selected columns overlap substantially, the image can be low pass filtered to improve the signal-to-noise ratio.

The resolution in the frequency encoding direction (x) is determined as in the standard Fourier imaging techniques by sampling bandwidth and gradient amplitude and duration. In the other spatial direction (y) of the imaging plane the resolution is determined by the thickness (a and b) and angles (α and β) of the selected planes. For the y and z directions, the point spread function (PSF) is a triangular function which depends on the thickness, a and b, and the angles, α and β, of the selected planes. The signal strength is determined by the cross-sectional area of the columns.

The width of the selected column defines the in-plane resolution and the height defines the image slice thickness. The half-maximum of the PSF is used to define the effective resolution. Hence, for the symmetric case, the effective image plane slice thickness can be defined as 0.5 a/cos α and the effective in-plane resolution as 0.5 a/sin α.

A simplified comparison of the SNR of the LSDI and 2D spin-warp techniques, will now be considered, with the same slice thickness assumed for both. The effective column width, CW, is defined as the ratio of the cross-sectional area and the slice thickness. By this definition, the actual slice thickness becomes irrelevant.

Consider an "ideal" uniform phantom which extends over the whole field of view (FOV). The signal received from each LSDI column excitation is proportional to the column width, and the standard deviation of the noise in the signal is denoted by σ. With Fourier encoding, only the zero phase encoding line ($k_y$=0) gives a nonzero NMR signal, with an amplitude proportional to the FOV. For this particular phantom, other k-lines contain only noise; the same as in the LSDI case. This is because, the Fourier transform of this phantom is a sinc function with its zeros located in k-space where the k-lines are acquired. The total noise in the Fourier image will depend on the number of k-lines, i.e. the image resolution N. The noise standard deviation in the Fourier image is the square root of the total noise variance, $\sigma^2 N$. For this particular phantom the following relationship holds:

$$\frac{SNR_F}{SNR_{LSDI}} = \frac{FOV/\sqrt{\sigma^2 N}}{CW/\sigma} = \frac{\sqrt{FOV}}{CW} = \sqrt{N} \quad (2)$$

Here the same spatial resolution is assumed in both imaging techniques, i.e. N=FOV/CW. It turns out that Eq. (2) holds for any phantom, given that N is high enough, such that all the significant spatial frequencies of the phantom are acquired. Equation (2), however, ignores the fact that for short repetition times, the influence of relaxation is different in the two methods. In the LSDI technique, it is the effective repetition time that will determine the steady-state longitudinal magnetization. For very small SNR, the bias due to the Rician distribution of the magnitude data also has to be considered.

The diffusion weighting is determined by the b-factor. The signal attenuation is then described as S(b)=S(0) exp(−b·ADC). The apparent diffusion coefficient (ADC) can be estimated as the slope of a linear least-squares fit to the logarithm of the signal amplitude acquired with two different b-values, e.g. low and high b-factors. The precision of the estimated diffusion coefficient depends on the choice of the b-factors. The low b-factor is made sufficiently large that the free induction decay (FID) resulting from the imperfect refocusing pulse π (60) is eliminated. This also minimizes the signal contribution from fast-moving intravascular spins. The optimal high b-factor can be found by computer simulation that considers the influence of the maximum gradient strength (0.01 T/m=1 G/cm) on the echo time and the transverse relaxation in brain tissue ($T_2 \approx 80$ ms for gray and white matter). The figure of merit is the average precision in the estimates of the diffusion coefficients, in the range from 0.1 μm²/ms to 1 μm²/ms. Simulation results indicate that the optimum b-factor for brain diffusion maps is close to 750 s/mm². However, the improvement in the precision is minimal as b exceeds 500 s/mm². For further general information on optimizing b-factors for diffusion imaging, see MR Diffusion Imaging of the Human Brain, Daisy Chien, Richard B. Buxton, Kenneth K. Kwong, Thomas J. Brady, and Bruce R. Rosen, JCAT, 14(4):514–520, 1990.

The optimum bandwidth is found by maximizing the SNR of the spin echo with respect to the sampling period. Because most of the signal energy comes from low spatial frequencies, the SNR criteria can be written by maximizing the ratio of the signal to the noise at the center of k-space. During acquisition of the data points that are sampled before reaching the center of k-space, i.e. $N_x/2$ points, and an equivalent time on the other side of the π pulse, the signal is attenuated by transverse relaxation. The noise is inversely proportional to the square root of the sampling period, T. Therefore:

$$T_{opt} = \arg\max_T \left\{ \exp\left(-\frac{TN_x}{T_2}\right) \sqrt{T} \right\} = T_2/2N_x \quad (3)$$

Note that with this optimal sampling period, the intrinsic spectral broadening due to $T_2$ relaxation does not present a problem, because it is smaller than the bandwidth per voxel, i.e. $(1/T_{opt})/N_x = 2/T_2 > 1/\pi T_2$. The PSF will be similar to the regular sinc function but with smaller sidelobes. With 128 samples in the frequency encoding direction, this indicates that the optimal bandwidth for brain imaging is in the range from 1.2 kHz to 2.4 kHz. Note that here the bandwidth refers to half of the frequency passband, i.e. BW=½ T. This low bandwidth makes the image very sensitive to field inhomogeneities and chemical shift distortions. For many studies on a 1.5 T system, either 8 kHz or 4 kHz bandwidth were used. At lower field strength a reduced bandwidth can be used, since distortions from field inhomogeneities and chemical shift scale with field strength. In preliminary experiments on a 0.5 T system, a 2 kHz bandwidth was found to give a good compromise between SNR and short repetition time.

Figure 7:
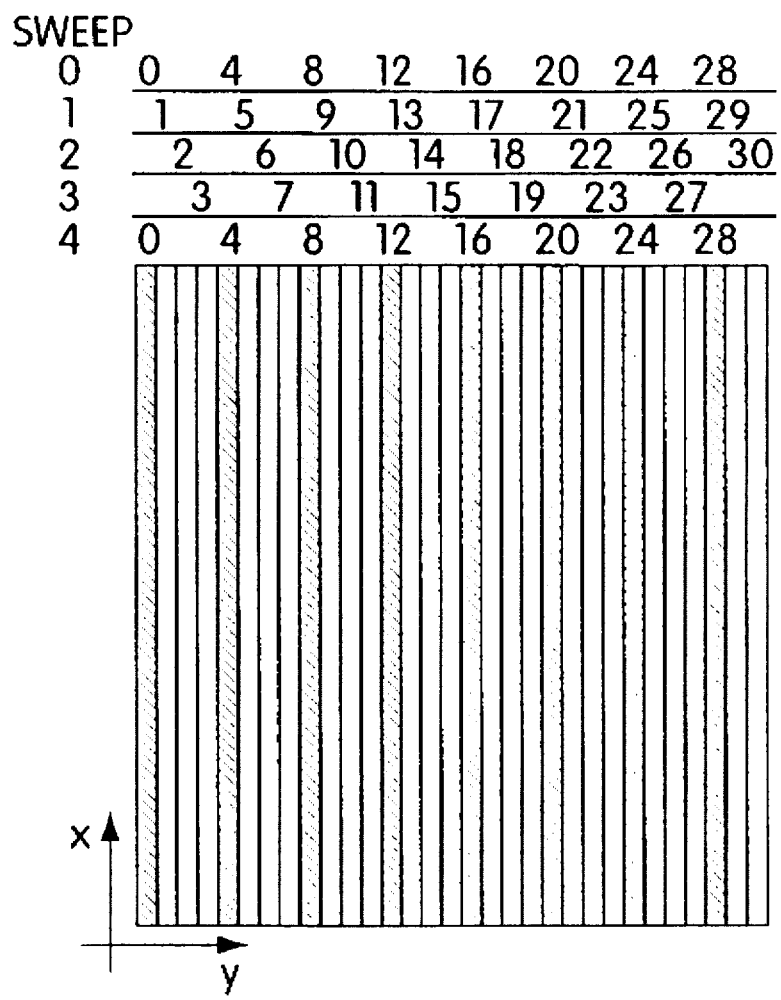
FIG. 7 is a diagram in the x-y plane illustrating the order of column acquisition in an interleaved acquisition sequence that interleaves the position of acquired columns for a line scan image composed of 31 columns and a column step size of four.

Referring to FIGS. 4, 5 and 7, dependent on the field of view, the number of columns and the size of their cross-sections a and b, the selected columns of an image may partially overlap. This overlap is of a substantive nature, i.e., it is a deliberate overlap of the defined boundaries of the imaging columns, which is different from the interaction between columns which arises because of undesirable out-of-slice excitation. The deliberate overlap can be beneficial in that it avoids loss of information from volumes between columns, which potentially could lead to interference patterns.

With overlapping columns, spin saturation is avoided by acquiring the columns in an interleaved acquisition sequence such as the interleaved acquisition sequence of FIG. 7, which employs a column step size of four. For a sufficiently large number of lines, the period between successive lines is then restricted primarily by the echo time required for adequate sensitivity to diffusion. To ensure steady state conditions for tissues with a very long longitudinal relaxation time, data is not collected for the first set of columns until they are re-excited at the end of the acquisition.

For a specific field of view $FOV_y$ in the y direction and a slice thickness a (a=b and α=β) the range of optimal numbers NSTEP of columns per sweep can be determined with the following relationship:

$$\frac{T}{TR} \leq NSTEP \leq \frac{FOV_y}{a} \sin\alpha \text{ with } T = -T_1 \ln(1-r) \quad (4)$$

where T is the time between successive sweeps, TR the repetition time, $T_1$ the longitudinal relaxation time (typically 1000 ms) and r the fraction of recovered magnetization in z direction after one sweep interval T (typically 90%). If NCOLUMN is the number of columns per image and NSTEP is selected such that NCOLUMN+1 is divisible by NSTEP then the number of sweeps and column position increment STEPSIZE equals (NCOLUMN+1)/NSTEP. The distance between two successively excited columns equals STEPSIZE times the column width a/sin α. With $i_{shot}$ as the excitation counter, the column number $i_{pos}$ for each excitation is given by $$i_{pos} := (STEPSIZE \times (i_{sho} \mod NSTEP) + [i_{sho}/NSTEP]) \mod NCOLUMN$$

Figure 9:
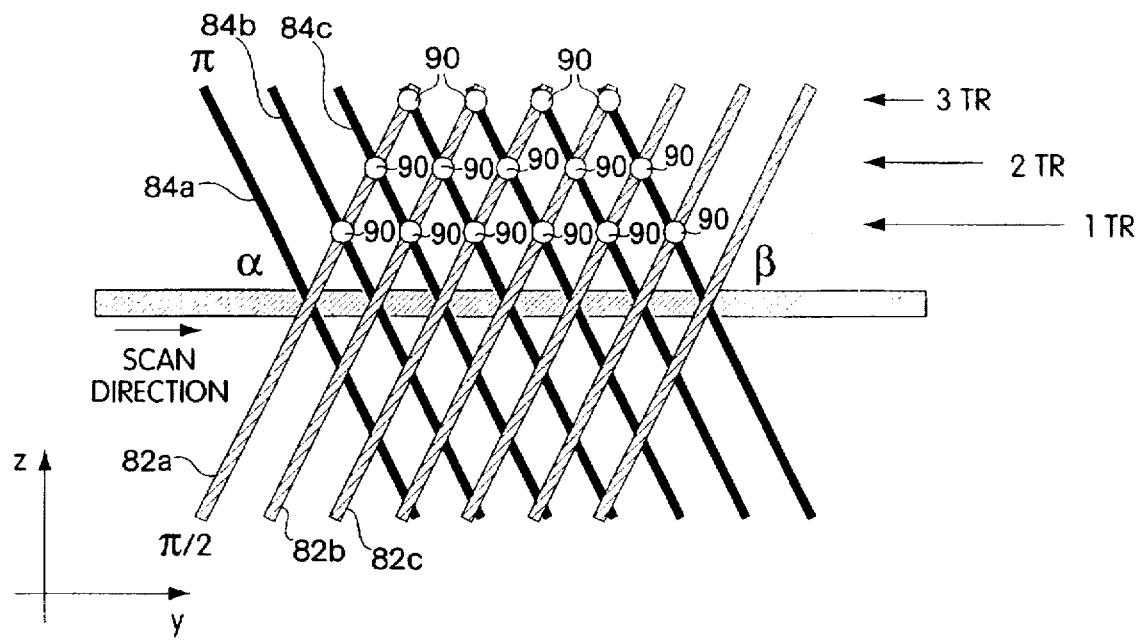
FIG. 9 is a diagram oriented in the y-z plane and presenting a sequence of selective excitations.

Referring to FIG. 9, in the repetitive process of column excitation, the selective π pulses 84a, 84b ... 84N (inversion pulses) intersect with previous selective π/2 pulses 82a, 82b ... 82N at several points 90 outside the image plane (both π and π/2 pulses are applied sequentially left to right in FIG. 9). Particularly if the diffusion gradients are turned off, this can lead to secondary echoes and ultimately to image artifacts, with the strength of these echoes decreasing with delay (number of repetition time intervals TR) between the selective pulses. Using this arrangement for each excitation, all previous π/2 pulses will contribute to secondary echoes by inversion after 1 TR, 2 TR, 3 TR, etc. To some extent these echoes can be reduced by crusher gradients after signal readout.

Figure 10:
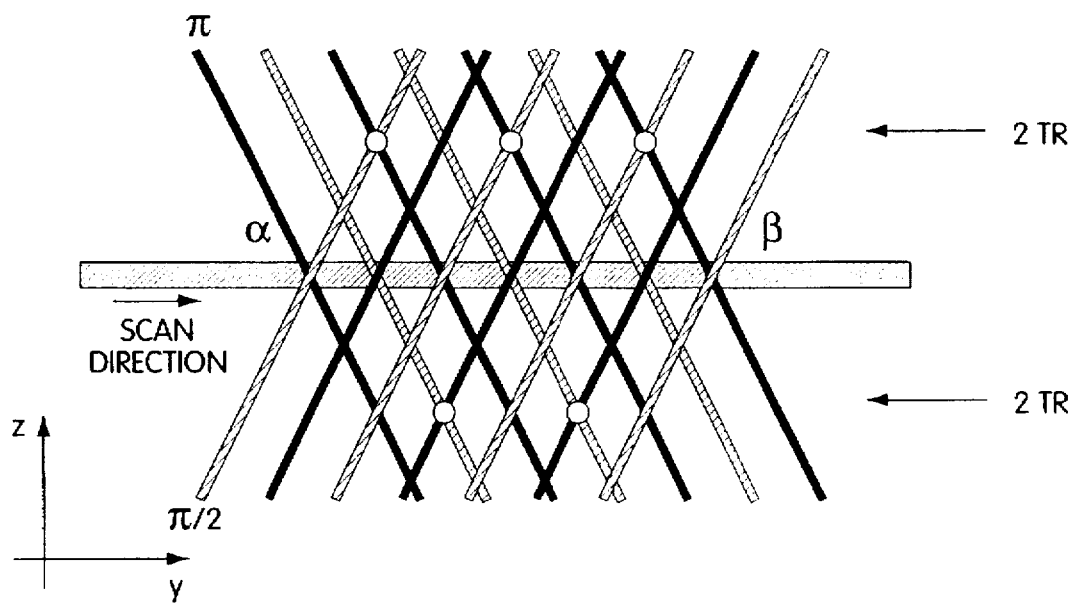
FIG. 10 is a diagram oriented in the y-z plane and presenting an alternative sequence of selective excitations with reduced secondary echoes.

Referring to FIG. 10, chopping of the orientation of the selective pulses allows for an efficient elimination of the strongest secondary echoes by postponing the refocusing of echoes such that $T_2$ and $T_2^*$ relaxation renders them insignificant. This permits a substantial reduction of duration and amplitude of the crusher gradients. It has been found that the crusher gradients can be eliminated altogether using this technique, with little impact on image quality. If signal averaging is applied in order to improve SNR, it is performed after calculating the magnitude of the signal to avoid introducing sensitivity to phase variations.

Figure 8:
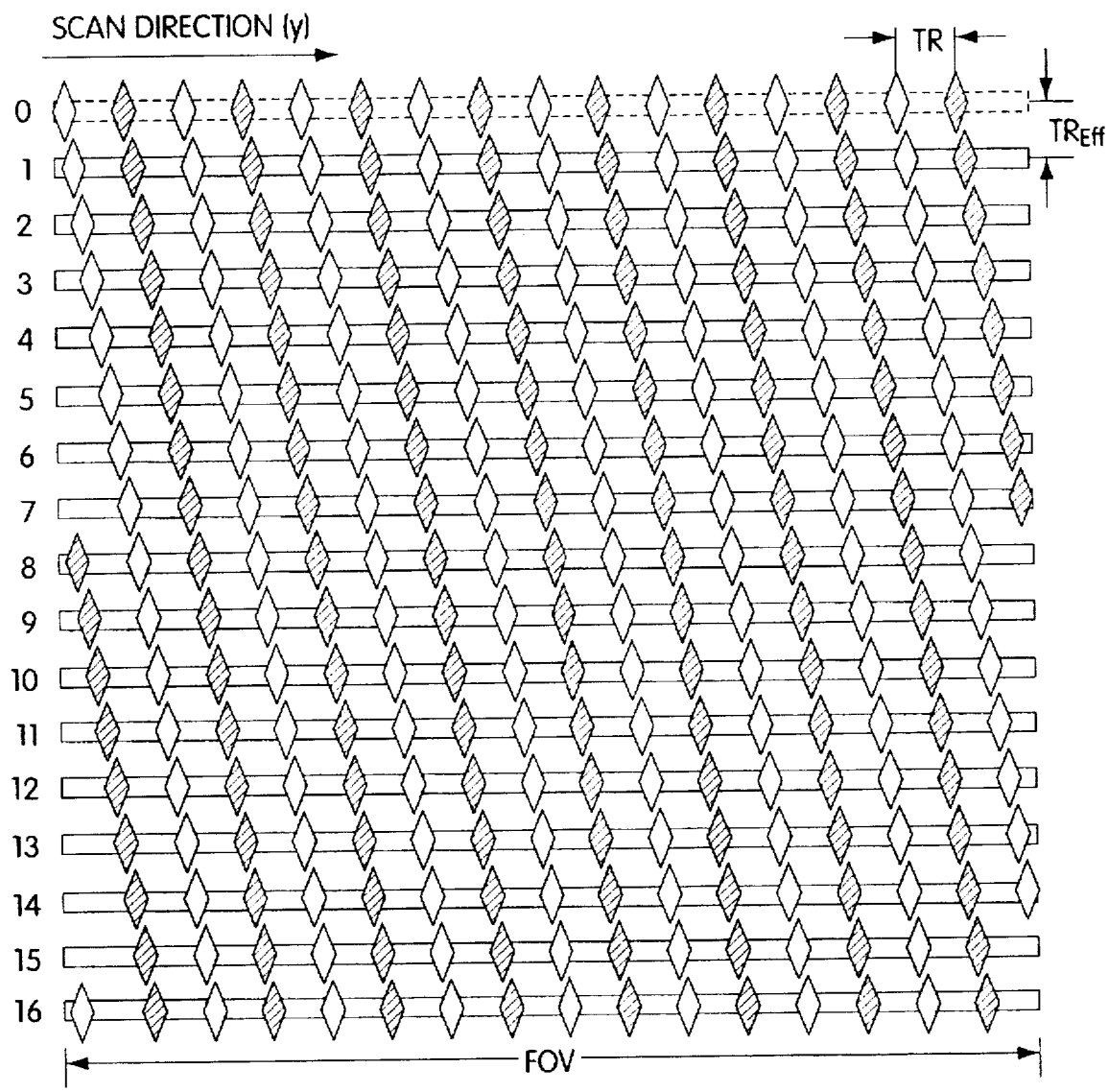
FIG. 8 is a table drawn to scale and illustrating the order of column acquisition in an interleaved acquisition sequence that interleaves both the position of acquired columns and gradient weighting for a line scan image composed of 127 columns, with a 240 mm FOV columns defined by 5 mm thick slices at 70° inclination angles, and a step size of 32.

Referring to FIG. 8, it is also possible to not only interleave the acquisitions of the lines within an image but also to interleave diffusion weighted (black parallelograms) and non-diffusion (or low diffusion) weighted (white parallelograms) image acquisition. By using images with an odd number of columns, two different diffusion weightings can be continuously interleaved such that two images are acquired simultaneously. The resulting duty-cycle can greatly reduce the load on the gradient amplifier, by as much as 50 per cent. Running diffusion weighted images at a short repetition time could otherwise destroy the gradient amplifiers. It may be desirable to acquire two images with each diffusion weight, and one image should be acquired with a positive gradient setting and the other with a negative gradient setting. The diffusion weighting would generally be practically the same, but this approach can eliminate the effects of, for example, the selection gradient when adding up these two images.

No data is collected during sweep number 0 (in dotted lines in FIG. 8), whereas, in sweep number 32, the columns of sweep number 0 are re-excited and data is acquired. The purpose of the first, additional sweep is to ensure steady-state magnetization in each column. This is important when columns overlap and if there is cross-talk due to imperfect slice profiles. It should be noted that if more than one image is acquired, with e.g. different b-factors, the extra sweep needs only to be performed once. Note that the spatial offset between the acquisition of columns in step 0 and step 1 is the same as that between the remaining steps, i.e., the dummy sweep is included in the interleaving.

The effective repetition time is defined as the time between the excitation of two adjacent columns. For all columns except number 0 it is given by:

$$TR_{eff} = [N/s] \cdot TR \quad (5)$$

Here TR refers to the repetition time of the π/2 excitation pulses, s is the step size, and N is the number of columns. From FIG. 8, one can conclude that if the number of columns were 128, the effective repetition time of the columns excited in sweep number 16 would be different from the effective repetition time of the other columns. Therefore, odd column numbers are used, e.g. 31, 63, 127, or 255.

Provided that $TR_{eff}$ is long enough, signal loss due to spin saturation is avoided. The column step size, s, is chosen such that $s \times FOV_y/N$ becomes larger than the column width. Apart from the time spent on the extra steady-state sweep, the total scan time for one image is given by $N \times TR$. A desirable feature of the interleaving of diffusion weightings is that it can totally eliminate any secondary echoes, which permits the sequence to be used effectively without crusher gradients. Furthermore, by making the low b-factor sufficiently high, FID resulting from imperfections in the refocusing pulse may be eliminated. Also, the strongest stimulated echo, which because of imperfect slice profiles comes from a large fraction of the image volume, can be successfully eliminated by alternating between the high and the low b-factor.

The number of scan lines per image can be 255 scan lines, and this works well with the interleaving scheme. But, it is also possible to only consider a limited number of scan lines, or vary a concentration of scan lines per centimeter and thereby change the so-called field of view $FOV_y$. The concentration may also vary within the image providing a complete FOV with points of interest depicted at higher resolutions. For example, a reduced field of view would cover two kidneys perfectly, and in this way scan time can be reduced considerably. These time savings would be important, for example, in conjunction with breath hold imaging.

With LSDI, reducing the number of columns has no effect on signal to noise for a given effective repetition time. This contrasts with 2DFT imaging techniques, where a rectangular field of view, with fewer phase encoding steps, results in less signal to noise. If the precise location of a lesion is known beforehand, in which case only a few slices need to be acquired, the total scan time is of the order of minutes. It may even be possible to "zero in" on an area of interest, such as a tumor, by successively imaging with a more and more restricted field of view, and this could allow the imaging to be performed relatively quickly.

It is also possible with LSDI to vary the column direction from line to line within the plane (e.g., radially) or to obtain images of non-planar surfaces, by aligning the columns along a curve. It is even possible to obtain images of closed surfaces, such as cylinders or cones, or overlapping surfaces, such as S-shaped curves. These types of shapes cannot be obtained in a single acquisition using Fourier transform methods. For example, it may be possible to prepare images which follow the curve of the spine, or to obtain conical sections in alignment with the wall of the heart.

In contrast to navigated pulsed-gradient and spiral-diffusion imaging, LSDI is generally immune to bulk motion artifacts, which makes it applicable to diffusion imaging in the abdomen. For imaging tissues other than heart muscle, LSDI does not require EKG gating, which facilitates LSDI in the clinical setting. Unlike echo planar diffusion imaging, it generally does not require any special gradient hardware and can, therefore, even be implemented on low-field systems. Furthermore, arbitrary oblique imaging planes can be defined. For single slice imaging, the LSDI technique can be faster than the navigated pulsed-gradient technique. In the case of LSDI, the image reconstruction can be straightforward and does not require post processing to eliminate bulk motion artifacts.

It is possible to incorporate cardic gating for heart scans and so-called breath hold imaging, to image abdominal organs where there can be problems with respiratory excursions of the organs. The acquisition can be segmented into short, ten to fifteen seconds breath holds and these images put together to eliminate the respiratory excursion of the major organs which can be around one centimeter.

Figure 11:
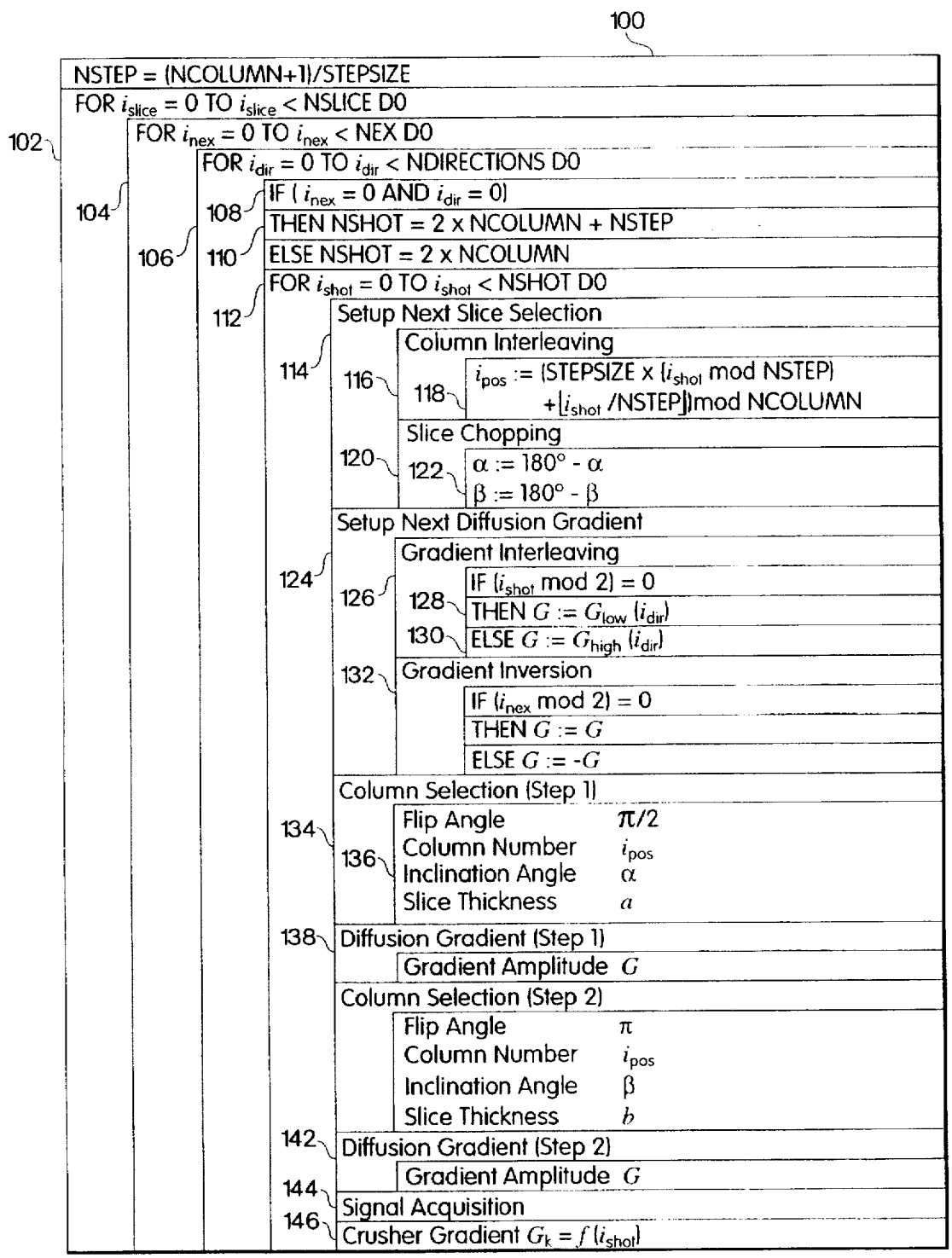
FIG. 11 is a flow diagram of a line scan diffusion imaging sequence for the acquisition of a full image using the embodiment of FIG. 1.

Referring to FIG. 11 and Table 2, the overall imaging sequence will now be discussed in more detail. The sequence begins by calculating the number of steps per sweep, from the number of columns per image and the STEPSIZE (block 100). The rest of the sequence includes a series of nested loops. The first FOR loop 102 (slice loop) handles multiplane operations, the second loop 104 handles signal averaging, and the third loop 106 loops over the different directions if one wants to measure diffusion in more than one direction. Usually one would perform a diffusion in three directions which are orthogonal to each other, proceeding from zero to less than three.

The first if condition 108 occurs at the beginning of the third loop 106. It checks if this is the first column excitation within the current slice, and if it is, a dummy sweep is performed (see block 110), as well as a normal run. Then follows a fourth loop 112, which is for the shot counter.

Within the fourth loop 112, the system 10 first sets up the next slice selection (block 114) and the column interleaving (block 116—see formula at block 118). Next, slice chopping is handled (block 120), in which the inclination angles are alternated after each acquisition (see block 122). This reduces or eliminates secondary echoes from outside the plane.

Once the system 10 has set up the next slice selection (block 114), it sets up the next diffusion gradient (block 124). This set up includes first performing the gradient interleaving (block 126) to reduce the load on the gradient amplifiers. Every second acquisition uses a low setting (block 128) of the gradient amplifier and every second uses a high setting (block 130), to alternate between these settings. Usually one would run at zero and maximum amplitude, but one can also run several diffusion weighting values. For example, one could linearly increase and decrease the strengths for both those gradients, keeping the load on the gradient amplifier the same on average over time.

Next begins gradient inversion (block 132), which is only used in connection with more than one average. This operation employs the $I_{nex}$ counter which is used by the second FOR loop 104, and simply inverts the amplitude. What follows after these two set-up sections is essentially a sequence which consists of a first column selection step (block 134), which is a slice selection (see parameters in block 136). The system applies the diffusion gradient for the first time in step 1 (block 138).

The second column selection step 2 (block 140) follows the application of the diffusion gradient, which is again a slice selection. The difference now is that the system 10 uses a refocusing $\pi$ pulse. Next, the system proceeds to a second diffusion gradient step (block 142), which is the second application of the diffusion gradient with amplitude G. Then follows the signal acquisition (block 144) and the optional crusher gradient (block 146) to eliminate any residual signal. Execution then returns to the slice loop 102.

TABLE 2

| | |
|---|---|
| Inclination Angles | $\alpha, \beta$ |
| Slice Thickness | a, b |
| Field of View | $FOV_x, FOV_y$ |
| Repetition Time | TR |
| Sweep Time | TS = NSTEP × TR |
| Diffusion Gradient Amplitude | G, $G_{low}, G_{high}$ |
| Number of Slices, Counter | NSLICE, $i_{slice}$ |
| Number of Excitations, Counter | NEX, $i_{nex}$ |
| Number of Diffusion Sensitivity Directions, Counter | NDIRECTIONS, $i_{dir}$ |
| Column Position Counter | $i_{pos}$, $0 \leq i_{pos} <$ NCOLUMN |
| Column Position Increment | STEPSIZE |
| Number of Columns per Image | NCOLUMN (is an odd number) (NCOLUMN + 1) is divisible by STEPSIZE |
| Number of Columns per Sweep | NSTEP = (NCOLUMN + 1)/STEPSIZE $a \times$ NSTEP $\leq FOV_y \times \sin \alpha$ |
| Column Excitations per Image, Counter | NSHOT, $i_{shot}$ |

In generating the images, it may be advantageous to enhance the diffusion information relative to the T2 information. Instead of using higher actual b-values during the acquisition, this can be accomplished by using the T2 image and the calculated ADC image to reconstruct images with b-values that are higher than the ones used during the acquistion.

It is also possible to employ a stimulated echo diffusion imaging technique, which allows for strong diffusion encoding even if gradient amplitudes are limited. In this technique, the selective (pi) inversion pulse is replaced by a selective (pi/2) pulse and a third pi/2 pulse is added. The plane defined by this third pulse is positioned such that it intersects with the volume excited by the first two pulses. The echo obtained after the third pulse is a stimulated echo.

It is frequently desirable to obtain images of a volume within a sample or patient. For example, after a stroke, diffusion-weighted MR imaging can be used to detect ischemia, well before the lesion becomes visible on conventional T2-weighted images, i.e., before irreversible infarction of the tissue has become established. It is therefore desirable to screen the entire brain or heart within minutes. This will not only improve patient comfort and throughput, but will also permit the investigation of short-term ischemia of the myocardium induced by physical exercise or drugs. Several different LSDI-based imaging techniques are applicable to obtaining images of volumes. These differ in their complexity of implementation, image artifacts, signal to noise, and scan time, and will now be discussed.

Figure 12:
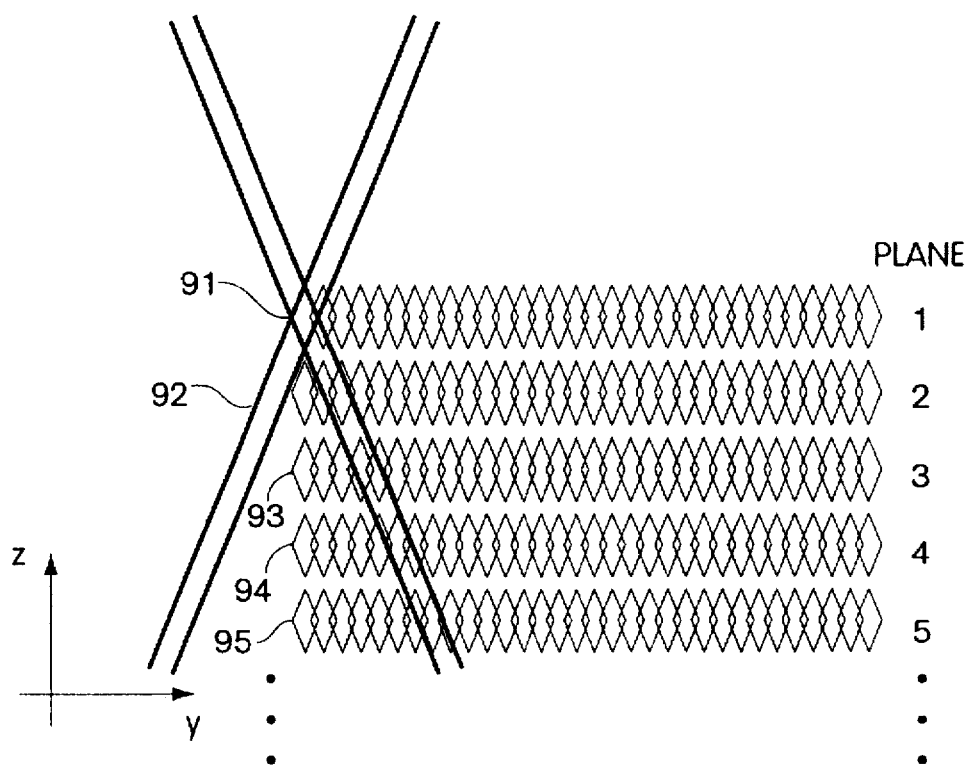
FIG. 12 is a diagram oriented in the y-z plane and illustrating successive columns used in an alternative exemplary volume acquisition sequence.

Referring to FIG. 12, volume acquisition can be performed by sequential acquisition of several image planes 91, 92, 93, 94, 95 . . . , as shown in FIG. 12. Because the signal-to-noise ratio is not influenced by a reduced field of view in the y direction given a fixed effective repetition time, it is possible to cover a volume of interest (e.g. the heart muscle) more efficiently with several rectangular fields of view. Although one might expect that sequential acquisition of lines of different image planes would reduce the problem of spin saturation, considering that the excitation with the $\pi$ and $\pi/2$ pulse saturates two slices, the least saturation actually occurs within the imaging plane, where the two planes intersect and the column is formed. It is therefore preferable to continue the acquisition of lines within the original imaging plane, rather than within a different plane.

Scan time can be reduced considerably by measuring diffusion in one direction only. And because the diffusion gradients are applied in all three directions at maximum amplitude, the gradient amplitude is improved by 73% compared to using the conventional gradient axis. With one diffusion direction only, however, the image contrast is also determined by fiber orientation.

In one embodiment volume acquisition is performed by sequentially using the three orthogonal directions of diffusion encoding, in the acquisition of successive lines. As in the case of keyhole imaging techniques, diffusion-weighted and T2-weighted images are obtained at maximum resolution, whereas an ADC trace map at lower resolution can be reconstructed, by combining the data of adjacent triplets of lines. Another possibility is the use of isotropic diffusion weighting gradients, which yield a rotationally invariant signal attenuation in a single excitation, but with a considerably longer duration of the diffusion gradients for a given diffusion encoding. Together with a reduced number of columns and a rectangular field of view, both methods may reduce the scan time for screening the entire brain to within 5 minutes. For more general background information about isotropic diffusion weighting gradients, see E. C. Wong, R. W. Cox, and A. W. Song, Optimized isotropic diffusion_weighting, Magnetic Resonance in Medicine, Volume 34, pages 139–143, 1995.

In observations of anisotropy maps obtained using the LSDI technique, it has been noted that the anisotropy apparent in a lesion varies with time after onset of a stroke. Acute lesions exhibit a high degree of anisotropy, whereas older lesions exhibit a lesser degree of anisotropy compared with the normal surrounding tissue. The LSDI technique has been found to be sufficiently sensitive and artifact-free to detect differences in age of lesions based on changes in anisotropy.

Figure 13:
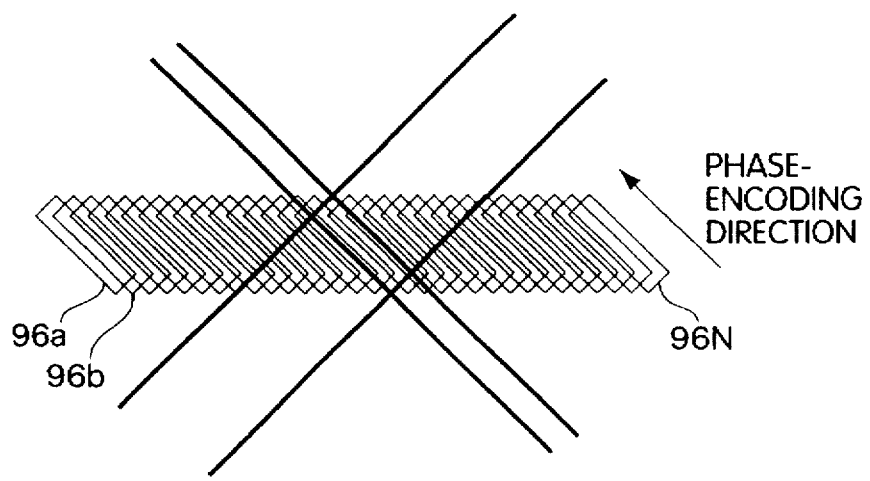
FIG. 13 is a diagram oriented in the y-z plane and illustrating successive columns used in a volume acquisition using line scan diffusion imaging.

Referring to FIG. 13, volume acquisition can also be achieved by selecting a series of columns 96a, 96b, . . . 96N with a rectangular cross-section and performing a limited number of phase encodings during one echo.

Figure 14:
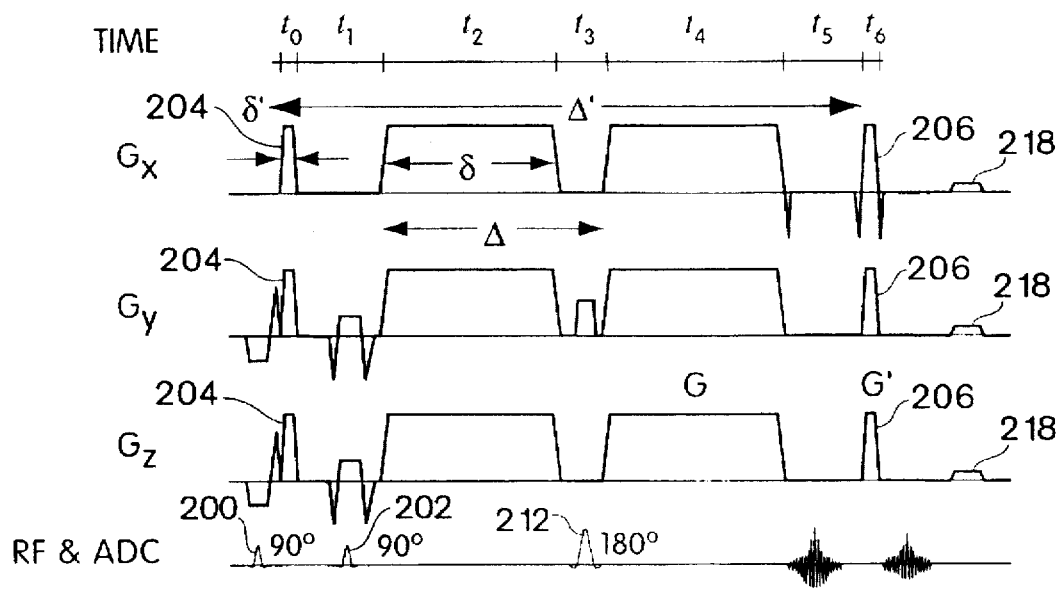
FIG. 14 is an imaging sequence diagram for the acquisition of data from two image planes simultaneously using echo time encoding.
Figure 15:
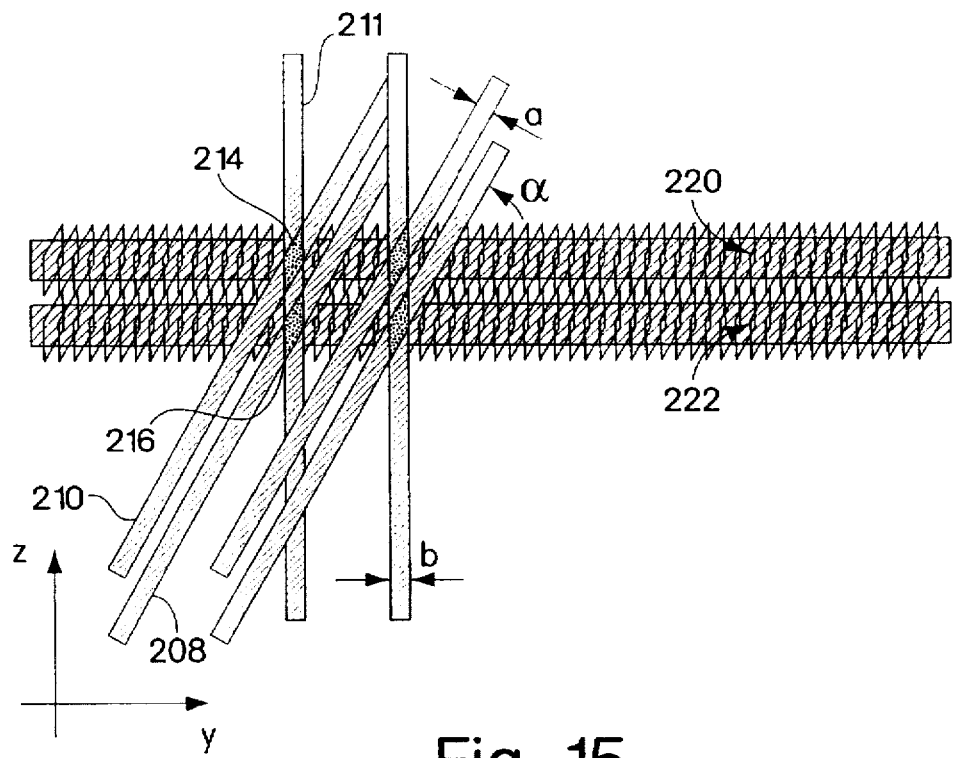
FIG. 15 is a diagram oriented in the y-z plane and illustrating the arrangement of four columns in two planes selected in two shots using the sequence of FIG. 14.

Referring to FIGS. 14 and 15, one way to reduce scan time in obtaining images of volumes is to apply time encoding of echoes. In this method, two or more slices are excited with a train of $\pi/2$ pulses 200, 202 that intersect a single plane defined by a $\pi$ pulse 203. Between the slice selections with the $\pi/2$ pulses, a dephasing gradient 204 is applied, and between readouts, a rephasing gradient 206 is applied. The purpose of these gradients is to produce an incremental phase twist across a plane, so that adjacent planes can be differentiated from each other. The first plane selected 208 has the highest amount of phase twist, and the last plane selected 210, which is affected only by the final blip 204, has the least amount of phase twist. A selective $\pi$ pulse 212 then defines a number of columns 214, 216 within the previously selected planes. Columns are selected in multiple imaging planes, rather than in a single imaging plane only, and diffusion gradients will be added.

With the arrangement of selected planes shown in FIG. 15, data for two planes 220, 222 can be obtained simultaneously although other numbers of planes are also technically possible. This type of sequence is dubbed double line scan diffusion imaging (DLSDI), and should reduce the total scan time by a factor of 2. Compared to the LSDI sequence, for a given total readout time, the bandwidth is increased by the same factor of 2, which would increase the noise by $\sqrt{2}$.

With nonzero diffusion gradients, the contribution from spins outside the intersection of the $\pi/2$ and the $\pi$ pulses can be considered negligible because of lack of rephasing. Similarly, to minimize interference between spins in the two columns, dephasing gradients 206 are used to dephase one of the columns during the readout of the other column. The timing of the readout for each of the two columns is set such that the magnetization excited by each of the $\pi/2$ pulses forms a spin echo during its line acquisition. Hence, the two columns acquired in each shot will have no $T_2^*$ weighting but different $T_2$ weighting as well as different diffusion weighting. However, since all the columns in each slice have the same weighting, this will not affect the calculation of the ADC, because within a limited range, the ADC is independent of the echo time.

The DLSDI sequence can use the same interleaving described above for LSDI, to minimize spin saturation, and a "dummy" pre-sweep, to ensure uniform equilibrium magnetization in both slices. The interleave step size determines the effective repetition time, $TR_{\mathit{eff}}$, i.e., how quickly the sequence sweeps through the image planes. Because the combined width of the slices produced by the two $\pi/2$ pulses in DLSDI is larger than the width of a single slice, the interleave step size should be larger than in an LSDI sequence. As in LSDI, the crusher gradients that trail the second readout period can be used to minimize spurious echoes from spins outside the two image planes. As is known, the amplitude of the crusher gradients should vary from shot-to-shot.

Since the angle a between the $\pi/2$ pulses 208, 210 and the imaging plane and the angle $\beta$ between the $\pi$ pulse 211 and the imaging plane differ, the intersection of the slices produced by the $\pi/2$ pulses and the $\pi$ pulse produces asymmetric point-spread function in the y and z directions. The signal-to-noise ratio is proportional to the area of the intersection which is given by $a \times b/\cos(\alpha)$. From the area, the effective slice thickness in z direction is given by $a/\cos(\alpha)$ because the in-plane resolution in y direction is b. The inclination angle, $\alpha$, and the thickness of the excited slices, a, are determined such that appropriate slice thickness and slice separation is achieved.

The area or the wavenumber of the dephasing gradients should be large enough such that the interference between the two echoes is minimal. This minimum area will depend upon the spatial frequencies of the object being imaged and the desired image voxel size. The echo from each column will be contaminated with the high spatial frequencies from the other column, but if the dephasing gradient's wavenumber is sufficiently high, the interference from high spatial frequencies can be considered insignificant as compared with the low spatial frequencies of the column being acquired. With a resolution of 96 in the frequency encoding direction, dephasing gradients with k' of 7 times the maximum wavenumber produced by the read gradient are typically used. With smaller crusher gradients, image artifacts have been noticed in phantoms with sharp edges.

The readout bandwidth is optimized such that maximum SNR is obtained. For the first echo, the optimal bandwidth is calculated in the manner described above for LSDI, i.e., $BW=N_x/T_2$, where $N_x$ denotes the resolution in the frequency encoding direction and $T_2$ is the transverse relaxation time. It may be desirable to use equal bandwidth for the two echoes, because the two images will tend to exhibit similar artifact levels. This will not optimize the bandwidth for the first echo, but since the SNR of the second echo tends to be lower, optimizing the bandwidth for the second echo can be more important. If equal bandwidth is used for both echoes, it can be shown that the optimal bandwidth for the second echo is $BW=3N_x/T_2$. Hence, for brain imaging with $T_2$ in the range from 50 ms to 100 ms and $N_x=96$, it is reasonable to expect the overall optimal bandwidth to be in the range from 1 kHz to 6 kHz.

The diffusion sensitivity of the slice that is reconstructed from the first echo can be determined by the Stejskal-Tanner formula:

$$b_1 = b = k^2(\Delta - \delta/3) \qquad (6)$$

where γ is the gyromagnetic ratio, G is gradient strength of the diffusion sensitizing gradients, and k is the corresponding wavenumber determined by the area of the diffusion gradients as:

$$k = \gamma \int_{t_0 + t_1}^{t_0 + t_1 + \delta} G(t) dt \qquad (7)$$

By writing the Stejskal-Tanner expression in terms of k, errors in Eq. (6) due to finite ramp times are negligible if Δ and δ denote the time between the beginning of the diffusion gradients and the duration of each gradient waveform, respectively. Calculation of the diffusion sensitivity of the other slice that is reconstructed from the second echo is more complicated because of influence from the dephasing gradients. The Stejskal and Tanner expression is described in more detail in E. O. Stejskal and J. E. Tanner, Spin diffusion measurements: Spin echoes in the presence of a time-dependent field gradient. *J. Chem. Phys.*, 42, 288—292, 1965. Ignoring the slice selective gradients and the read gradient, diffusion sensitivity is given by:

$$b_2 = b' + b + k = k2\Delta \qquad (8)$$

where $b' = k'^2(\Delta' - \delta'/3), k' = \gamma^{\delta'} \int_0 G'(t) dt$ and G' denotes the amplitude of the dephasing gradients. The first slice is refocused immediately following the RF-pulse, then defocused again before the second RF-pulse, to minimize cross-terms in the diffusion weighting of the second echo. Also, by choosing G' and G of opposite polarity, it is possible to make the cross-terms k'k2Δ cancel b'. However, this may not produce sufficient isolation between the two echoes.

As described above, this technique interleaves the acquisition of columns with a low non-zero b-factor and a high b-factor, thereby, simultaneously collecting diffusion weighted and non-diffusion weighted images. This both reduces gradient heating and eliminates problems with spurious echoes.

To obtain isotropic ADC-trace diffusion weighting, the diffusivity has to be measured in three orthogonal directions. As described above, this is performed with six measurements, using high and low b-factors in three orthogonal directions, (−1, 1, −½),(1, ½, −1), and (½, 1, 1). This can also be done by using only four measurements (0, 0, 0), (−1, 1, −½),(1, ½, −1) and (½, 1, 1) although it tends to increase the noise in the ADC-trace by approximately 11% if an optimal b-factor is used (i.e. bD≈1). The noise per unit time with four measurements is about 9% lower. Gradient amplifier overheating may limit the speed of the four-measurement technique.

The amplitude and polarity of each individual dephasing gradient is chosen such that the dephasing gradient vector is always in the same direction as the diffusion gradient vector. This simplifies the calculations for the diffusion sensitivity of the second echo, especially when anisotropic diffusion has to be considered. By changing the direction of the dephasing gradient along with the diffusion gradient, a simple expression like Eq. (8) can be used to calculate the diffusion sensitivity. The amplitude of the dephasing gradient vector, however, is always kept constant.

Figure 16:
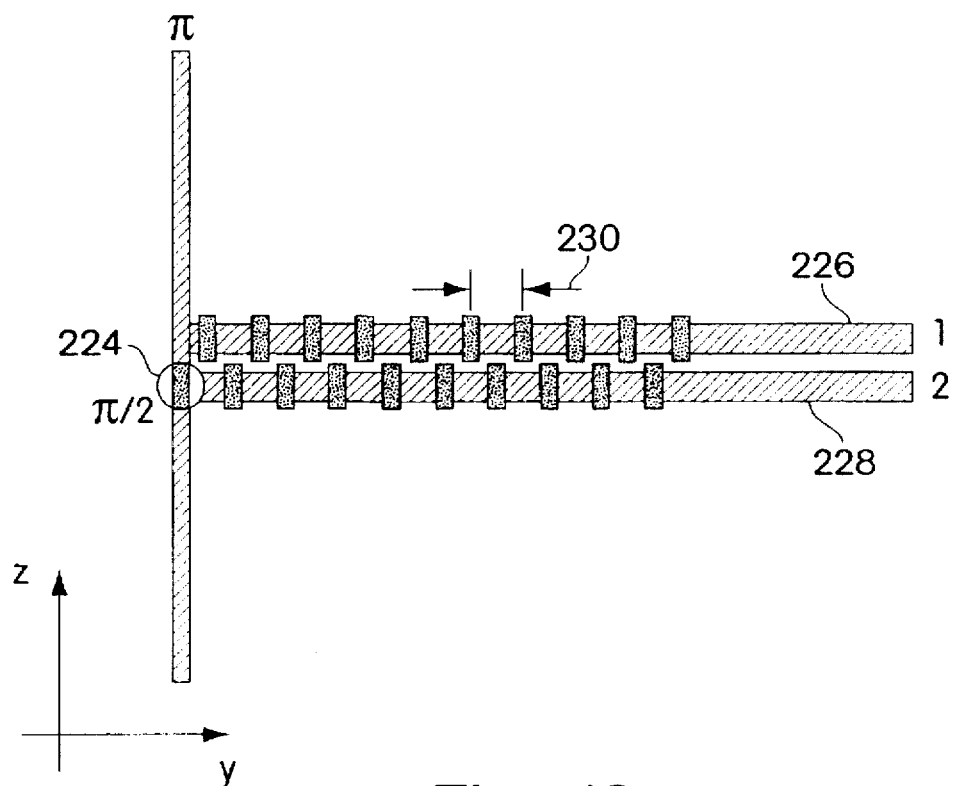
FIG. 16 is a diagram oriented in the z-y plane and illustrating the acquisition of data from columns in two planes using 2D spiral excitation pulses.
Figure 17:
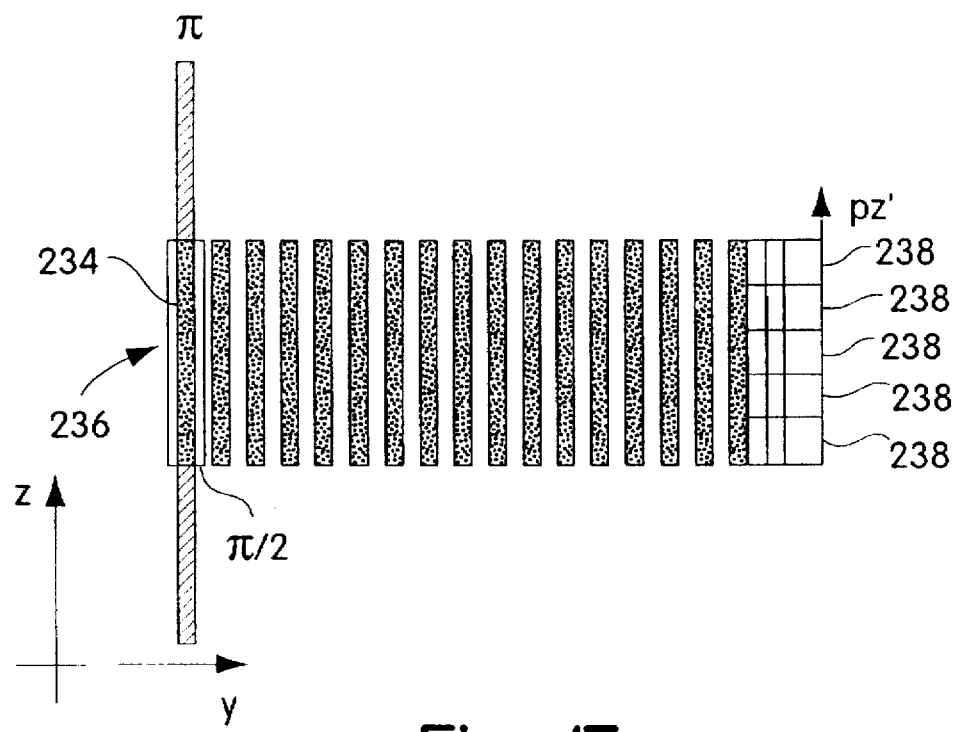
FIG. 17 is a diagram oriented in the z-y plane and illustrating acquisition using 2D selective pulses $\pi/2$ and an echo planar readout.

Referring to FIGS. 16, and 17, to some extent it appears that the speed of the LSDI technique may be limited by spin saturation. Replacing the selective π/2 pulse with a two-dimensional (2D) selective pulse may reduce spin saturation considerably. One possible arrangement for column selection employs 2D spiral pulses, which each excite a cylindrical volume 224. With a spiral k-space excitation scheme and conventional field gradients, a cylinder diameter of 10 mm can be achieved.

In the implementation of the LSDI sequence presented above in connection with FIG. 2, the typical thickness of the selective planes is 5 mm. With an inclination above connection with angle of 70°, the half-width of the rhomboid-shaped column cross section is 2.7 mm, and the half-height, 7.4 mm. The cross section defined by the 2D spiral pulse is considerably larger. A selective π pulse 225, which inverts spins within a thin (e.g., 3 mm) slice, produces an almost ideal rectangular column cross section (3 by 10 mm). By placing the slice defined by the inversion pulse vertically with respect to the imaging plane (e.g., 228), the saturation within that plane is limited to the excited column 224. As illustrated in FIG. 16, the repetitive column excitation progresses from left to right, but also from imaging plane (226) to imaging plane (228). In this way, the cylinders defined by the 2D spiral pulses do not overlap, and the planes defined by the inversion pulse can be placed adjacent each other. As can be concluded from FIG. 16, the minimal step distance 230, avoiding overlap of consecutively excited columns, equals the slice thickness b defined by the inversion pulse (e.g., 3 mm), whereas with the implementation employing the sequence of FIG. 2, the minimal step distance is b/sin α (e.g., 5 mm/sin 70°, i.e., 5.3 mm).

With spiral 2D-selective pulses a large halo of spins is excited outside the cylinder. For a gradient echo, this large volume of spins, which is excited at a low RF tip angle, may contribute considerably to the signal measured. In this particular application, this imperfection is irrelevant, because as a result of the selective inversion pulse, only a very small fraction of spins outside the cylinder augment the signal.

With the version 5.5 release of the SIGNA scanner software (EPIC development environment), 2D selective pulses can be run without additional gradient and computer hardware.

Figure 18:
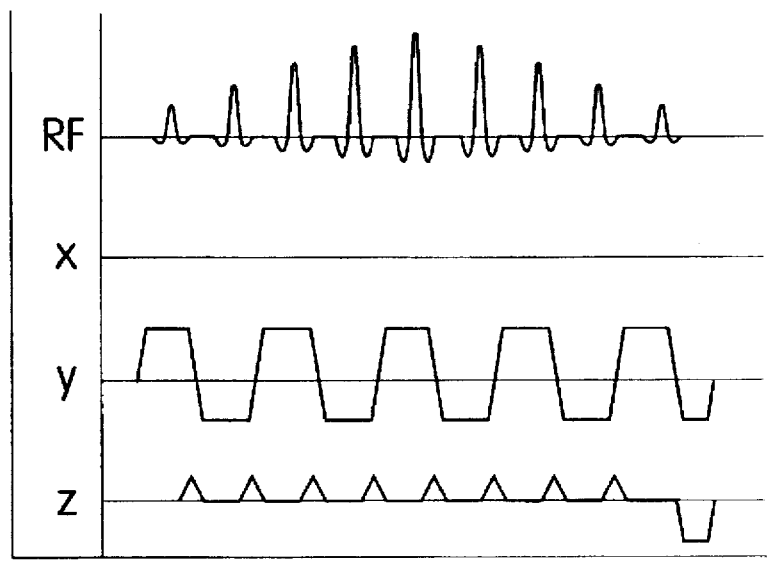
FIG. 18 is an RF excitation sequence diagram employed for each 2D selective $\pi/2$ pulse of FIG. 17.

Referring to FIGS. 17-20, another technique called Fourier spliced pencil diffusion imaging uses a 2D-selective RF pulse, as shown in FIG. 18, to excite only a strip 234 within a slice 236. The excitation is followed by an echo-planar readout, such as one employing the sequence illustrated in FIG. 20. Since the field of view in the phase-encoding direction is limited by the width 240 of the strip, the number of phase encodes needed for a given resolution is reduced. For further information on Fourier spliced pencil imaging, see O. Heid, Fourier spliced pencil imaging, Book of Abstracts, Third Annual Meeting, Nice Society of Magnetic Resonance, Berkeley, Calif., 1995.

Figure 19:
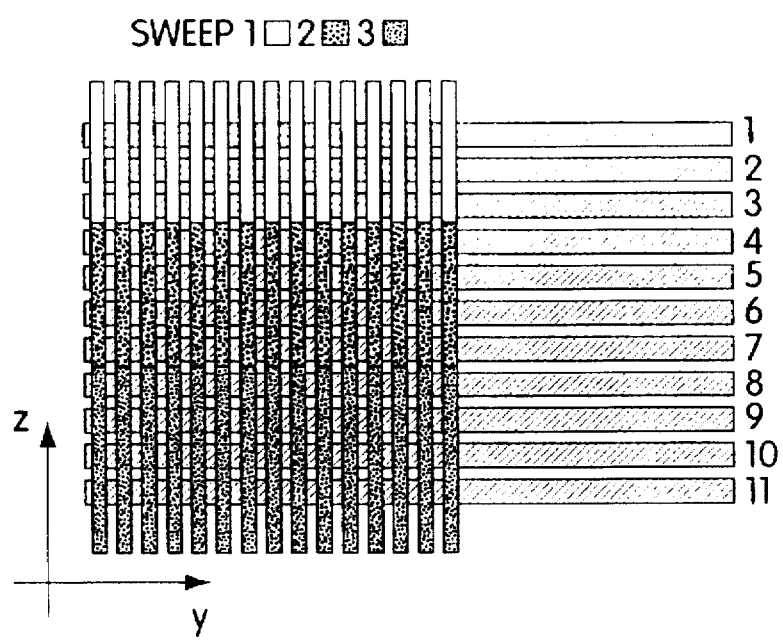
FIG. 19 is a diagram oriented in the z-y plane and illustrating the sweep acquisition of multiple groups of planes using 2D selective pulses similar to those illustrated in FIG. 17.

For volume coverage, image planes can be obtained by combining the data from several strips. The strips (e.g., 234) may be placed either orthogonally with respect to the image planes or within these image planes. With an orthogonal placement, as shown in FIG. 17, echo planar readout with phase encoding along pz' defines the slice thickness 238 in the z direction. The thickness of the slices defined by the π/2 and π pulses determines the in-plane resolution in the y direction. It appears to be advantageous to make the slice of the π inversion pulse thinner (e.g., 3 mm) than the slice of the π/2 2D-selective pulse. 2D-selective pulses exhibit a gradual fall-off of the RF tip angle and, consequently, the signal toward the edge of the strip. By combining data of slightly overlapping strips, as shown in FIG. 19, the signal variation within the final image should be minimal.

For a scanner with limited gradient strength and readout bandwidth, the number of phase encodes should be small, and, therefore, the strips should be narrow. On the other hand, at low bandwidth, artifacts due to fat shift and field inhomogeneity increase. This leads to particularly strong artifacts, if, as during echo-planar readout, lines in k space are traversed in alternating directions. A technique for overcoming this problem, and which moreover permits imaging on systems with relatively poor gradient waveforms employs the sequence shown in FIG. 20. This technique relies on asymmetric switching of the readout gradient and performs readout in one direction only, whereby the fly-back in the opposite direction is achieved with a short blip of the readout gradient x at maximum slew rate and amplitude (see FIG. 21). For more general background information related to this technique, see D. A. Feinberg, R. Turner, M. von Kienlin, and P. D. Jakab, Echo-planar imaging with asymmetric gradient modulation and inner-volume excitation, Magnetic Resonance in Medicine, Volume 13, pages 162–169, 1990, and F. Hennel and J. F. Nedelec, Interleaved asymmetric EPI with standard gradients, Book of Abstracts, Third Annual Meeting, Nice Society of Magnetic Resonance, Berkeley, Calif., 1995.

Instead of using a 2D-selective pulse, a volume can be defined by the intersection of a slice-selective pulse $\pi/2$ and a selective inversion pulse $\pi$. If so, only spins within the desired volume are selected. This is an advantage compared to volume selection with the 2D-selective pulse used in Fourier spliced-pencil imaging, which can suffer from aliased excitations. However, the geometric arrangement with slice selective pulses is more complex than that with 2D-selective pulses. The selective excitation of a strip, similar to the one described above in connection with FIG. 17, can be realized with a saturation pulse that suppresses the signal outside the strip.

Figure 20:
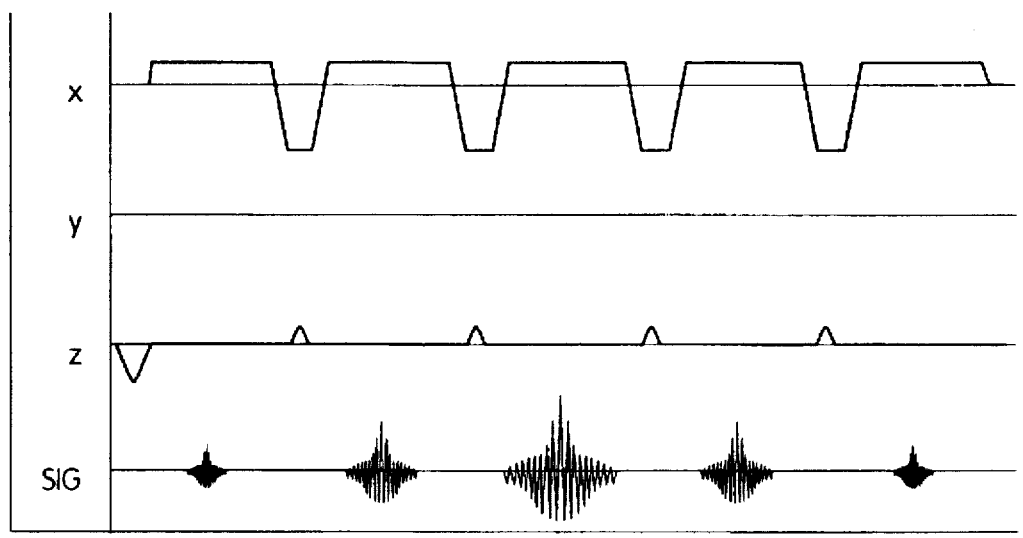
FIG. 20 is an imaging sequence diagram for the unidirectional echo-planar readout used to acquire data from the strips shown in FIG. 19.
Figure 21:
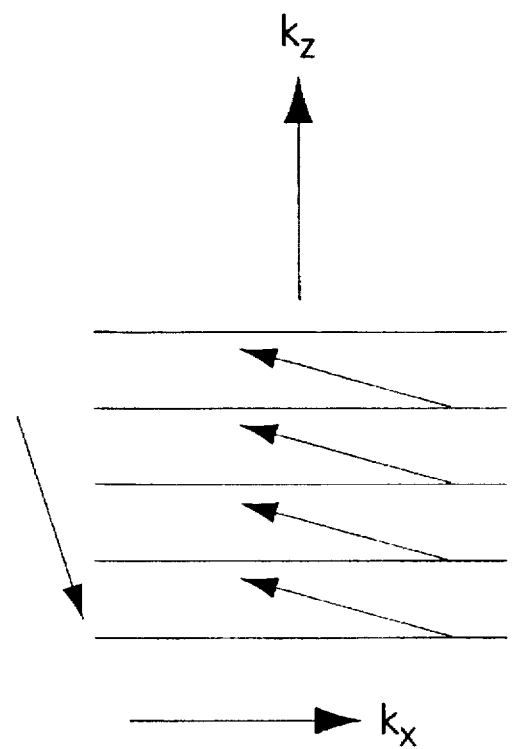
FIG. 21 is a diagram illustrating the k space trajectory of the echo-planar readout for the sequence of FIG. 20.
Figure 22:
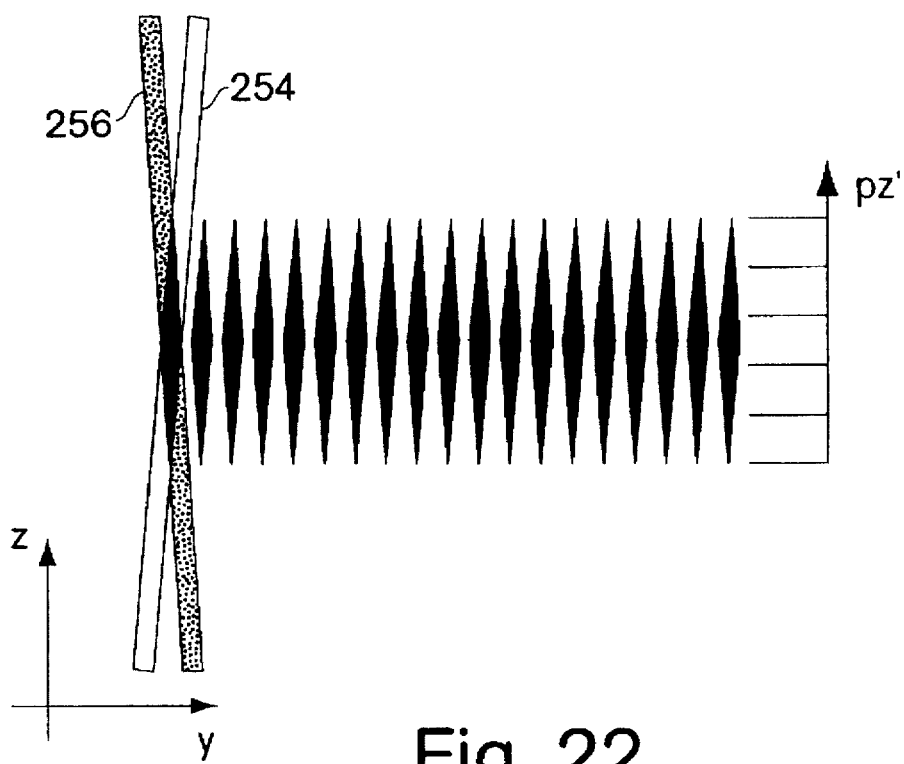
FIG. 22 is a diagram oriented in the z-y plane and illustrating volume selection with selective pulses at an inclination angle close to 90°.
Figure 23:
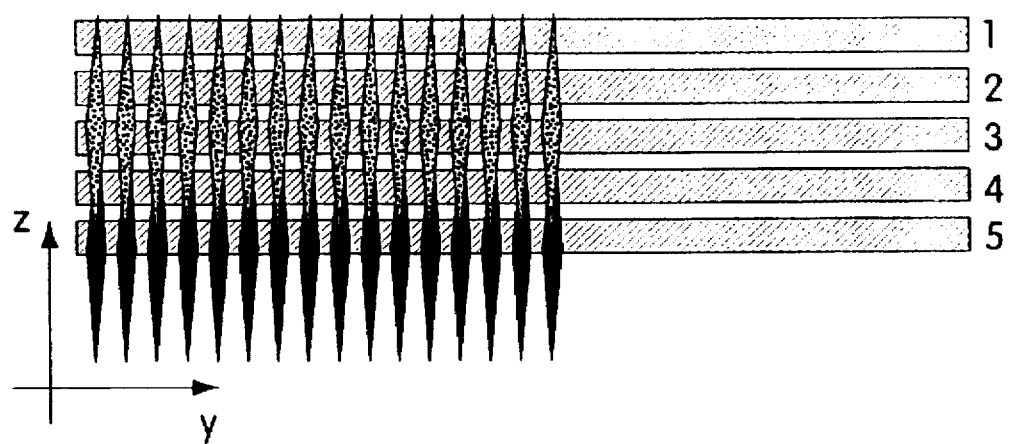
FIG. 23 is a diagram oriented in the z-y plane and illustrating the collection of data using the selection pulses presented in FIG. 22 for five planes employing three sweeps with overlapping volumes.

Referring to FIGS. 22–23, another possible arrangement with the phase encoding in the z direction is shown to perform volume selection with a selective $\pi/2$ pulse 254 and $\pi$ pulse 256 at an inclination angle close to 90° (i.e., the acute angle between the planes defined by the pulses in each pair of pulses is less than about fifteen degrees). The in-plane resolution is defined by the slice thickness of the selective $\pi/2$ and $\pi$ pulses. Several planes can be acquired in one sweep using this technique. In consecutive sweeps, vertically overlapping scans can be combined to eliminate signal and in-plane resolution non-uniformity caused by variations in column thickness, as shown in FIG. 23. An echo-planar readout with an asymmetric gradient waveform with phase encoding along pz', as illustrated in FIGS. 20–21, is used to resolve columns of different planes. As shown in FIG. 23, with three sweeps and overlapping volumes, data of five planes are collected.

Figure 24:
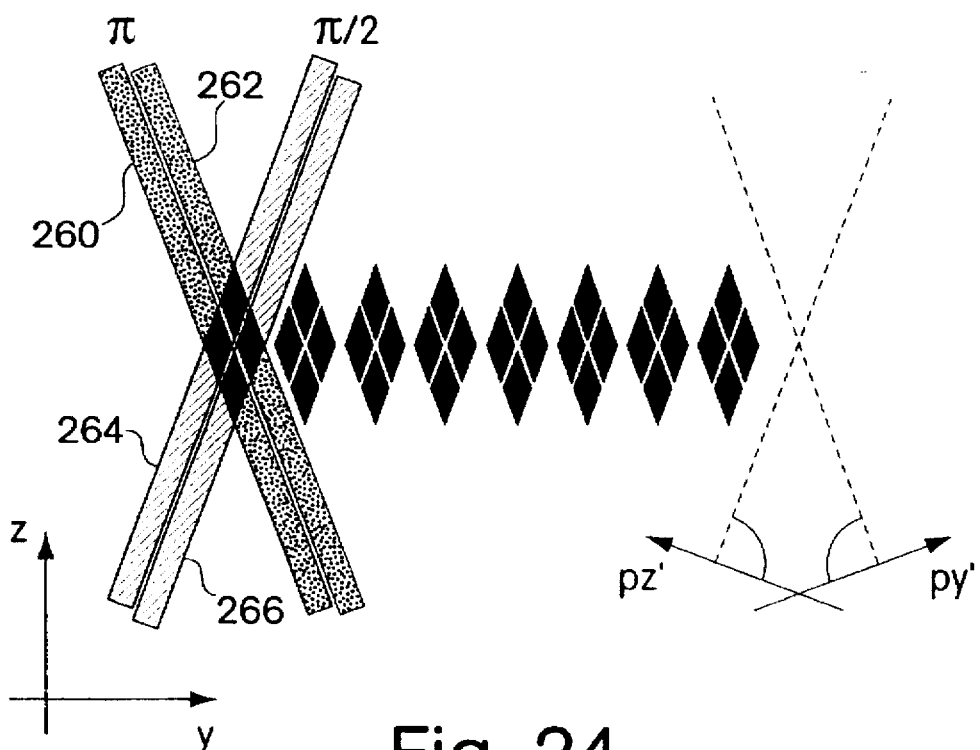
FIG. 24 is a diagram oriented in the z-y plane and illustrating the simultaneous selection of multiple columns with double-frequency selection pulses.
Figure 25:
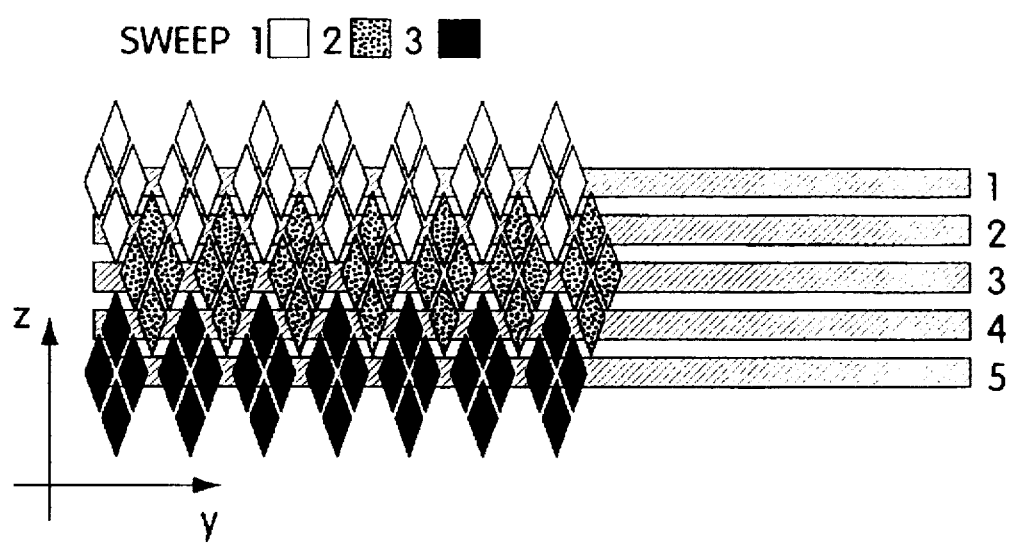
FIG. 25 is a diagram oriented in the z-y plane and illustrating the collection of data using selection pulses similar to those presented in FIG. 24 for five planes employing three sweeps and overlapping volumes.

Referring to FIGS. 24–25, more than one column can be excited simultaneously, by using two or more frequencies for selective $\pi/2$ RF pulses 260, 262 and $\pi$ RF pulses 264, 266. With the GE SIGNA system, such pulses can be created with standard hardware and software. A possible arrangement for the selection of four columns is shown in FIG. 24. The distance between columns in the y direction equals the minimal step distance of the LSDI sequence described above in connection with FIG. 2. The signal of the individual columns is separated by an echo-volumar readout with phase encoding orthogonal to each selective plane. As with the echo-planar readout (FIG. 20), asymmetric switching of the readout gradient can be applied. For further general background information on echo-volumar techniques, see P. R. Harvey and P. Mansfield, Echo-volumar imaging (EVI) at 0.5 T: First whole-body volunteer studies. Magnetic Resonance in Medicine, Volume 35, pages 80–88, 1996.

Phase encoding is performed along the directions py' and pz'. During readout an asymmetric gradient waveform is applied (see FIGS. 20 and 21). Even though the point spread function in the phase encoding directions equals a Sinc function with the first minimum in the center of the neighboring volume, the cross talk between the volumes should be minimal. This is because the volumes are clearly separated by a decreasing RF tip angle toward the edge of the selected volumes. (One might also consider the selection of a single large column, which is split up into four or more smaller columns by phase encoding, but with such an arrangement, the point spread function of each column becomes highly asymmetric and depends on the position of the column within the selected volume.) The total gain in speed for multiple planes (see FIG. 25), however, is between two- and four-fold. For a given total readout time the bandwidth is increased by the number n of phase encodes, which equals the number of columns used. For signal-to-noise comparisons, each phase encode adds one measurement, which means that the signal-to-noise value is increased by a factor of $\sqrt{n}$. On the other hand, the n-fold bandwidth decreases signal to noise by a factor $\sqrt{n}$. This means that, for a constant readout time, the signal-to-noise ratio of the 3DFT is independent of the number of columns and of readout bandwidth, and should be the same as that of the 1DFT-LSDI sequence presented above in connection with FIG. 2.

The above techniques can be implemented on a 1.5 Tesla Full Body Imager, with SIGNA Software Release 5.4, by General Electric Medical Systems of Milwaukee, Wis. Of course, other systems could be used as well, with specific architectural features differing from those shown in FIG. 1. The above techniques can be used in detecting ischemia and infarction, and in particular they have been used successfully in imaging the brain for early diagnosis and evaluation of acute ischemic strokes. Other applications include imaging in the heart, abdomen, and in particular in the kidneys. In addition, since diffusion is a very temperature sensitive parameter, LSDI can be used for monitoring hyperthermia treatment of tumors.

EXAMPLE

Figure 26:
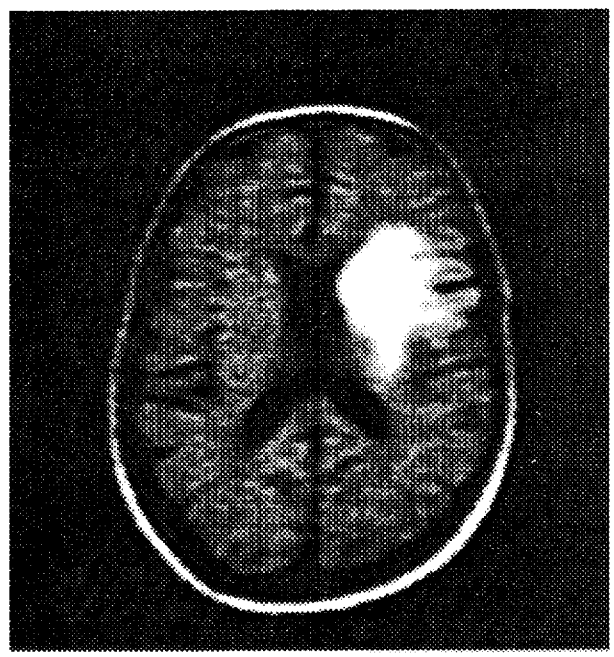
FIG. 26 is a line scan diffusion image of the brain of a 45 year old female patient 8 hours after an acute stroke.

Referring to FIGS. 2 and 26, Images were taken of a 45 year old female stroke patient 8 hours after onset of an acute stroke, using minimal head restraints and no cardiac gating. Images were taken with different diffusion weightings using the LSDI sequence presented above in connection with FIG. 2. As can be seen in FIG. 26, the ischema is clearly visible. While there have been shown and described what are at present considered the preferred embodiments of the present invention, it will be obvious to those skilled in the art that various changes and modifications may be made therein without departing from the scope of the invention as defined by the appended claims.

We claim:

1. A magnetic resonance imaging method comprising:
providing a series of selective radio frequency pulses that includes a series of pairs of radio frequency pulses, which pairs each define a pair of planes that intersect at an intersection that defines an imaging volume, wherein the imaging volumes defined by the pairs are distinctly positioned and are part of a first image surface passing through the sample and having a spatial orientation that differs from the spatial orientation of the planes defined by the pairs, providing magnetic diffusion gradients in the sample and associated with at least a subset of the imaging volumes, acquiring a series of nuclear magnetic resonance echo signals resulting from the intersection of the planes in the step of providing a series of selective pulses, wherein at least a subset of the nuclear magnetic resonance echo signals are responsive to the influence of the diffusion gradients, and processing the nuclear magnetic resonance echo signals acquired in the step of acquiring to obtain an image that includes lines corresponding to the imaging volumes defined by the pairs.

2. The imaging method of claim 1 wherein at least some of the individual imaging volumes in the first set of volumes overlap.

3. The imaging method of claim 2, wherein the volumes are defined in an interleaved sequence that separates in time the definition of spatially adjacent ones of the imaging volumes by defining others of the volumes during the period between the definitions of the adjacent ones of the volumes.

4. The imaging method of claim 3, further including, before the step of providing a series of selective radio frequency pulses, the step of providing a series of pairs of dummy radio frequency pulses, which pairs each define a pair of dummy planes that intersect at an intersection that defines a dummy volume, wherein the dummy volumes defined by the dummy pairs are located in the imaging surface, and wherein the step of providing a series of selective radio frequency pulses provides pairs of pulses that define ones of the imaging volumes that are coextensive with the dummy volumes.

5. The imaging method of claim 4, wherein the volumes are acquired in a series of successively offset sweeps across the image surface, and wherein a first of the offset sweeps is a dummy sweep.

6. The magnetic resonance imaging method of claim 3, wherein the total number of lines per image acquired is odd.

7. The imaging method of claim 1, wherein the step of providing a series of selective pulses alternately swaps the orientation of first and second successively defined pairs of the selective radio frequency pulses, such that the plane defined by the first pulse in time in the first of the successive pairs does not coincide within the sample with the plane defined by the last pulse in time in the second of the successive pairs.

8. The magnetic resonance imaging method of claim 7 wherein the step of acquiring is performed without any crusher gradients.

9. The imaging method of claim 1, wherein the step of providing a series of selective radio frequency pulses includes providing at least a third selective radio frequency pulse for each of the pairs of radio frequency pulses, wherein a plane defined by each of the third selective radio frequency pulses intersects one of the planes defined by one of the pairs at an intersection that defines a further imaging volume, wherein the further imaging volumes defined by the third selective radio frequency pulses and the pairs are part of a second image surface passing through the sample and having a spatial orientation that differs from the spatial orientation of the planes defined by the pairs and the planes defined by the third pulses.

10. The imaging method of claim 9, wherein the step of acquiring includes steps of providing magnetic dephasing and rephasing gradients to separate the nuclear magnetic resonance echo signals resulting from the intersections from the nuclear magnetic resonance echo signals resulting from the further intersections.

11. The imaging method of claim 10, wherein the steps of providing a dephasing and rephasing gradients and the step of providing magnetic diffusion gradients in the sample respectively provide magnetic dephasing and rephasing gradients and a magnetic diffusion gradient that are parallel for the volume defined for each pair and the volume defined for the third selective radio frequency pulse and that pair.

12. The imaging method of claim 9 wherein the step of acquiring employs an echo-volumar or echo-planar sequence.

13. The imaging method of claim 9 wherein the pulses in each of the pairs are multiple-frequency pulses.

14. The imaging method of claim 1 wherein the step of providing magnetic diffusion gradients in the sample provides differing diffusion gradients for successively defined imaging volumes.

15. The imaging method of claim 1, wherein the step of providing a series of selective radio frequency pulses includes providing a further series of selective radio frequency pulses that includes a series of further pairs of radio frequency pulses, which further pairs each define a pair of further planes that intersect at an intersection that are part of a further imaging volume, wherein the further imaging volumes defined by the further pairs define a second image surface passing through the sample adjacent the first image surface and having a spatial orientation that differs from the spatial orientation of the planes defined by the further pairs.

16. The imaging method of claim 15, wherein the imaging volumes that are part of the first surface are all defined before the imaging volumes that are part of the second surface are defined.

17. The imaging method of claim 15, wherein individual ones of the imaging volumes overlap individual ones of the second set of volumes.

18. The imaging method of claim 1, further including the step of employing the first image to evaluate tissue ischemia.

19. The imaging method of claim 1, further including cardiac gating to obtain diffusion images of the heart.

20. The imaging method of claim 1, further including the step of acquiring the volumes during breathhold.

21. The imaging method of claim 1, further including the step of employing the image to monitor temperature.

22. The imaging method of claim 1, wherein the acute angle between the planes defined by the pulses in each pair is less than about fifteen degrees, and wherein the step of acquiring employs an echo-planar sequence to obtain image data for a plurality of image surfaces including the first image surface.

23. The imaging method of claim 22, further including the step of providing a series of saturation pulses to saturate signals from unwanted volumes within the sample.

24. The imaging method of claim 1, wherein diffusion values measured within the imaging volumes are enhanced such that the image generated in the step of processing employs a higher b-factor than a b-factor resulting from the step of providing magnetic diffusion gradients.

25. The imaging method of claim 1, wherein the step of providing a series of selective radio frequency pulses includes providing at least a third selective radio frequency pulse for each of the pairs of radio frequency pulses, wherein a plane defined by each of the third selective radio frequency pulses intersects with the volume defined by one of the pairs of pulses, such that the echoes aquired in the step of aquiring are stimulated echoes.

26. The imaging method of claim 1 wherein the step of providing a series of selective radio frequency selective pulses defines the imaging volumes in a radial pattern.

27. The method of claim 1, wherein the acute angles between the image surface and each of the planes defined by the pairs are equal.

28. The method of claim 1, wherein the acute angles between the image surface and each of the planes defined by the pairs are in the range of 65 degrees to 75 degrees.

23

29. The imaging method of claim 1 wherein the image surface is a closed or overlapping surface.

30. A magnetic resonance imaging method comprising:
providing a series of selective radio frequency pulses that includes a series of pairs of radio frequency pulses, which pairs each define a pair of planes that intersect at an intersection that defines an imaging volume, wherein the imaging volumes defined by the pairs are distinctly positioned and are part of a first image surface passing through the sample and having a spatial orientation that differs from the spatial orientation of the planes defined by the pairs, and wherein the step of providing a series of selective pulses alternately swaps the orientation of first and second successively defined pairs of the selective radio frequency pulses, such that the plane defined by the first pulse in time in the first of the successive pairs does not coincide within the sample with the plane defined by the last pulse in time in the second of the successive pairs, acquiring a series of nuclear magnetic resonance echo signals resulting from the intersection of the planes in the step of providing a series of selective pulses, and processing the nuclear magnetic resonance echo signals acquired in the step of acquiring to obtain an image that includes lines corresponding to the imaging volumes defined by the pairs.

31. The magnetic resonance imaging method of claim 30 wherein the step of acquiring is performed without any crusher gradients.

32. A magnetic resonance imaging method comprising:
providing a series of selective radio frequency pulses that includes a series of pairs of radio frequency pulses, each of the pairs defining a pair of planes that intersect at an intersection that defines an imaging volume, wherein the imaging volumes defined by the pairs are distinctly positioned and are part of a first image surface passing through the sample, and wherein the step of providing a series of selective radio frequency pulses is performed in an interleaved manner to successively define the imaging volumes with different sensitivities to a parameter, acquiring a series of nuclear magnetic resonance echo signals resulting from the intersection of the planes in the step of providing a series of selective pulses, and processing the nuclear magnetic resonance echo signals acquired in the step of acquiring to obtain at least one image that includes lines corresponding to the imaging volumes defined by the pairs.

33. The magnetic resonance imaging method of claim 32 further including the step of providing magnetic diffusion gradients in the sample and associated with at least a subset of the imaging volumes, wherein the parameter relates to the magnetic diffusion gradients, and wherein the step of providing magnetic diffusion gradients in the sample provides differing diffusion gradients for successive ones of the imaging volumes.

34. The magnetic resonance imaging method of claim 33 wherein the differing magnetic diffusion gradients differ in their magnitude.

35. The magnetic resonance imaging method of claim 33 wherein the differing magnetic diffusion gradients differ in their directions.

36. The magnetic resonance imaging method of claim 33 wherein the differing diffusion gradients have the same directions, but opposite polarities.

37. The magnetic resonance imaging method of claim 33 wherein the step of providing magnetic diffusion gradients

24 repeatedly provides four differing diffusion gradients including a low magnitude diffusion gradient and including three orthogonally oriented high magnitude diffusion gradients.

38. The magnetic resonance imaging method of claim 33 wherein the step of providing magnetic diffusion gradients repeatedly provides six differing diffusion gradients including three orthogonally oriented low magnitude diffusion gradients and three orthogonally oriented high magnitude diffusion gradients.

39. A magnetic resonance imaging method comprising:
providing a series of selective radio frequency pulses that includes a series of pairs including a selective two-dimensional radio frequency and another selective radio frequency pulse, wherein the two dimensional radio frequency pulse in each pair defines a pulse-defined volume and the other radio frequency pulse in that pair defines a plane that intersects the pulse-defined volume at an intersection that defines an imaging volume, wherein the imaging volumes defined by the pairs are distinctly positioned and form part of a plurality of image surfaces passing through the sample, providing magnetic diffusion gradients in the sample and associated with at least a subset of the imaging volumes, acquiring a series of nuclear magnetic resonance echo signals resulting from the intersection of the pulse-defined volumes and the planes in the step of providing a series of selective pulses, wherein at least a subset of the nuclear magnetic resonance echo signals are responsive to the influence of the diffusion gradients, and processing the nuclear magnetic resonance echo signals acquired in the step of acquiring to obtain a plurality of images that each include lines corresponding to the imaging volumes in one of the imaging surfaces.

40. The magnetic resonance imaging method of claim 39 wherein the step of providing a series of selective pulses provides the selective two-dimensional radio frequency pulses as two-dimensional spiral pulses.

41. The magnetic resonance imaging method of claim 39 wherein the step of providing a series of selective pulses alternates between defining imaging volumes in different individual ones of the plurality of image surfaces.

42. The magnetic resonance imaging method of claim 39 wherein the selective two-dimensional radio frequency pulses are Fourier-spliced pencil pulses and the pulse-defined volumes are strips that extend across more than one of the plurality of image surfaces, and wherein the step of acquiring employs an echo-planar sequence to obtain the image data for the plurality of image surfaces.

43. The magnetic resonance imaging method of claim 39 wherein the step of providing selective radio frequency pulses includes providing a series of further pairs each including a selective two-dimensional radio frequency and another radio frequency pulses, wherein the two dimensional radio frequency pulse in each further pair defines a further pulse-defined volume and the other radio frequency pulse in that further pair defines a plane that intersects the further pulse-defined volume at an intersection that defines a further imaging volume, wherein the further imaging volumes defined by the pairs are distinctly positioned and define a plurality of image surfaces passing through the sample, and wherein the step of processing the nuclear magnetic resonance echo signals acquired in the step of acquiring further includes obtaining further images that each include lines corresponding to the further imaging volumes in one of the further imaging surfaces.

44. A magnetic resonance imaging apparatus, comprising:

means for providing a series of selective radio frequency pulses that includes a series of pairs of radio frequency pulses, which pairs each define a pair of planes that intersect at an intersection that defines an imaging volume, wherein the imaging volumes defined by the pairs are distinctly positioned and are part of a first image surface passing through the sample and having a spatial orientation that differs from the spatial orientation of the planes defined by the pairs, means for providing magnetic diffusion gradients in the sample and associated with at least a subset of the imaging volumes, means for acquiring a series of nuclear magnetic resonance echo signals resulting from the intersection of the planes in the step of providing a series of selective pulses, wherein at least a subset of the nuclear magnetic resonance echo signals are responsive to the influence of the diffusion gradients, and means for processing the nuclear magnetic resonance echo signals acquired in the step of acquiring to obtain an image that includes lines corresponding to the imaging volumes defined by the pairs.

45. A magnetic resonance imaging method, comprising:

simultaneously exciting orthogonal gradient coils to a first plurality of extents during a magnetic resonance imaging sequence to sensitize the sequence to diffusion in a first direction, simultaneously exciting the orthogonal gradient coils to a second plurality of extents during a second magnetic resonance imaging sequence to sensitize the sequence to diffusion in a second direction, the first direction being orthogonal to the second direction, and simultaneously exciting the orthogonal gradient coils to a third plurality of extents during a third magnetic resonance imaging sequence to sensitize the sequence to diffusion in a third direction, the first, second, and third directions being orthogonal to each other, wherein there are first, second, and third ones of the gradient coils, and wherein each of the steps of simultaneously exciting includes exciting each of the first, second and third of the three orthogonal gradient coils.

46. The magnetic resonance imaging method of claim 45, wherein the first direction is defined by a plurality of extents including respective relative amplitudes of $(-1, 1, -\frac{1}{2})$ for the first, second, and third coils, wherein the second direction is defined by a plurality of extents including respective relative amplitudes of $(1, \frac{1}{2}, -1)$ for the first, second, and third coils, and wherein the third direction is defined by a plurality of extents including respective relative amplitudes of $(\frac{1}{2}, 1, 1)$ for the first, second, and third coils.

* * * * *